US010148265B2

(12) United States Patent
Lu et al.

(10) Patent No.: US 10,148,265 B2
(45) Date of Patent: Dec. 4, 2018

(54) RADIO FREQUENCY SWITCHING CIRCUIT WITH DISTRIBUTED SWITCHES

(71) Applicant: pSemi Corporation, San Diego, CA (US)

(72) Inventors: Jianhua Lu, San Diego, CA (US); Peter Bacon, Derry, NH (US); Raul Inocencio Alidio, Carlsbad, CA (US); Vikram Sekar, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/660,675

(22) Filed: Jul. 26, 2017

(65) Prior Publication Data

US 2018/0131368 A1 May 10, 2018

Related U.S. Application Data

(63) Continuation-in-part of application No. 15/597,029, filed on May 16, 2017, now Pat. No. 9,900,004.
(Continued)

(51) Int. Cl.

| | |
|---|---|
| *H03K 17/687* | (2006.01) |
| *H04B 1/00* | (2006.01) |
| *H03K 17/693* | (2006.01) |
| *H03K 17/10* | (2006.01) |
| *H04B 1/44* | (2006.01) |

(52) U.S. Cl.
CPC ......... *H03K 17/687* (2013.01); *H03K 17/102* (2013.01); *H03K 17/693* (2013.01); *H04B 1/006* (2013.01); *H04B 1/44* (2013.01)

(58) Field of Classification Search
CPC .. H03K 17/687; H03K 17/693; H03K 17/102; H04B 1/44; H04B 1/006
See application file for complete search history.

(56) References Cited

U.S. PATENT DOCUMENTS 4,837,530 A * 6/1989 Kondoh ................. H01P 1/227
327/328
4,929,855 A 5/1990 Ezzeddine
(Continued)

FOREIGN PATENT DOCUMENTS

EP 0424113 4/1991

OTHER PUBLICATIONS

Hiltunen, Thomas S., Office Action received from the USPTO dated Sep. 8, 2017 for U.S. Appl. No. 15/597,029, 7 pgs.
(Continued)

*Primary Examiner* — Thomas J Hiltunen
(74) *Attorney, Agent, or Firm* — Jaquez Land Greenhaus LLP; Martin J. Jaquez, Esq.; John Land, Esq.

(57) ABSTRACT

An RF switching device having distributed shunt switches distributed along transmission lines to improve RF bandwidth as well as the signal isolation of the device. The shunt switches may be physically positioned on both sides of the transmission lines to keep an integrated circuit (IC) design essentially symmetrical so as to provide predictable and reliable operational characteristics. Some embodiments include stacked FET shunt switches and series switches to tolerate high voltages. In some embodiments, the gate resistor for each FET shunt switch is divided into two or more portions.

26 Claims, 16 Drawing Sheets

Related U.S. Application Data which is a continuation of application No. 14/995,023, filed on Jan. 13, 2016, now Pat. No. 9,685,946, which is a continuation-in-part of application No. 14/610,588, filed on Jan. 30, 2015, now Pat. No. 9,831,869.

(56) References Cited

U.S. PATENT DOCUMENTS

| | | | |
|---|---|---|---|
| 4,978,932 A | 12/1990 | Gupta et al. | |
| 5,023,494 A | 6/1991 | Tsukii | |
| 5,061,911 A | 10/1991 | Weidman | |
| 5,159,297 A | 10/1992 | Tateno | |
| 5,180,998 A | 1/1993 | Willems | |
| 5,289,142 A * | 2/1994 | Upton | G01S 7/034 327/237 |
| 5,990,580 A | 11/1999 | Weigand | |
| 6,803,680 B2 * | 10/2004 | Brindle | H01L 27/0203 257/E27.016 |
| 7,280,006 B2 | 10/2007 | Hase | |
| 8,103,221 B2 * | 1/2012 | Ta | H04B 1/48 333/101 |
| 8,482,360 B2 | 7/2013 | Chang et al. | |
| 9,537,472 B2 * | 1/2017 | Lu | H03K 5/08 |
| 9,685,946 B2 * | 6/2017 | Lu | H03K 17/687 |
| 9,742,400 B2 * | 8/2017 | Bakalski | H03K 17/693 |
| 9,780,761 B1 * | 10/2017 | Ben-Yishay | H03H 11/245 |
| 9,831,869 B2 * | 11/2017 | Lu | H03K 17/002 |
| 9,900,004 B2 | 2/2018 | Lu et al. | |
| 2003/0025487 A1 * | 2/2003 | Jian | H04B 1/0458 324/95 |
| 2008/0315351 A1 * | 12/2008 | Kakehata | H01L 27/112 257/507 |
| 2011/0316062 A1 * | 12/2011 | Kondo | H01L 29/93 257/312 |
| 2016/0226481 A1 | 8/2016 | Lu | |
| 2017/0237418 A1 | 8/2017 | Lu et al. | |
| 2017/0324407 A1 * | 11/2017 | Lu | H03K 17/687 |

OTHER PUBLICATIONS

Lu, et al., Preliminary Amendment filed in the USPTO dated Jul. 26, 2017 for U.S. Appl. No. 15/597,029, 7 pgs.

Lu, et al., Response filed in the USPTO dated Oct. 25, 2017 for U.S. Appl. No. 15/597,029, 8 pgs.

Athina, Nickitas-Etienne, International Preliminary Report on Patentability received from the International Bureau of WIPO dated Aug. 10, 2017 for appln. No. PCT/US2016/013278, 7 pgs.

Hiltunen, Thomas J., Notice of Allowance received from the USPTO dated Dec. 6, 2017 for U.S. Appl. No. 15/597,029, 13 pgs.

* cited by examiner

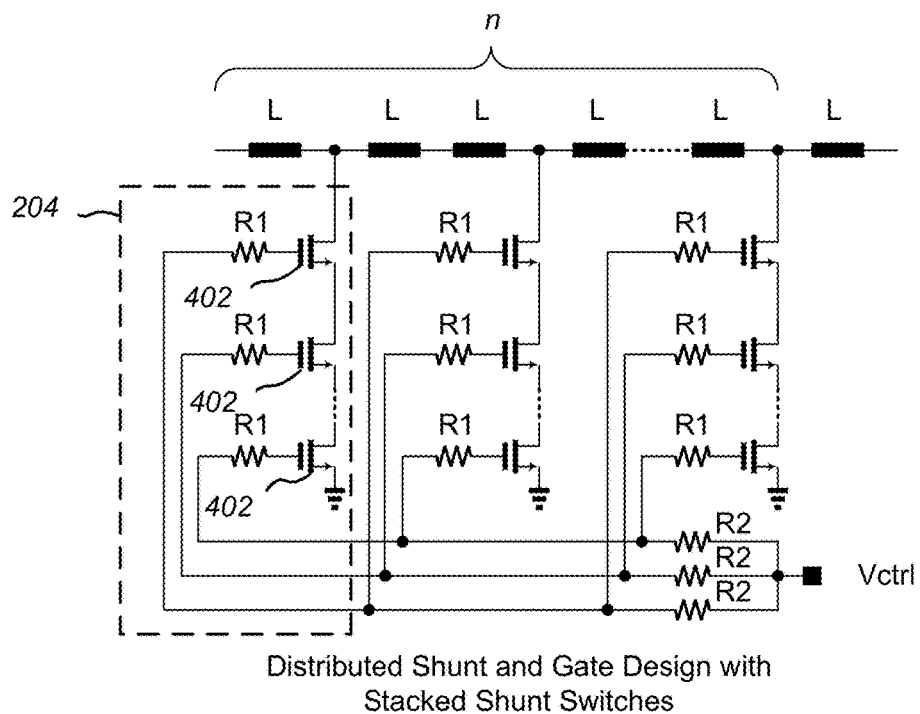
Distributed Shunt and Gate Design with
Stacked Shunt Switches
FIG. 4A
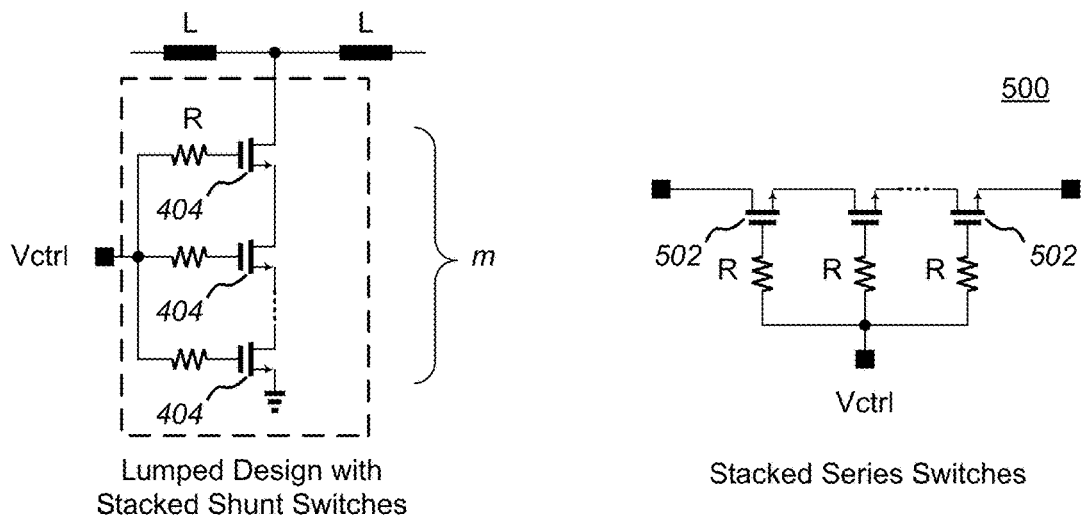
Lumped Design with
Stacked Shunt Switches
FIG. 4B
Stacked Series Switches
FIG. 5

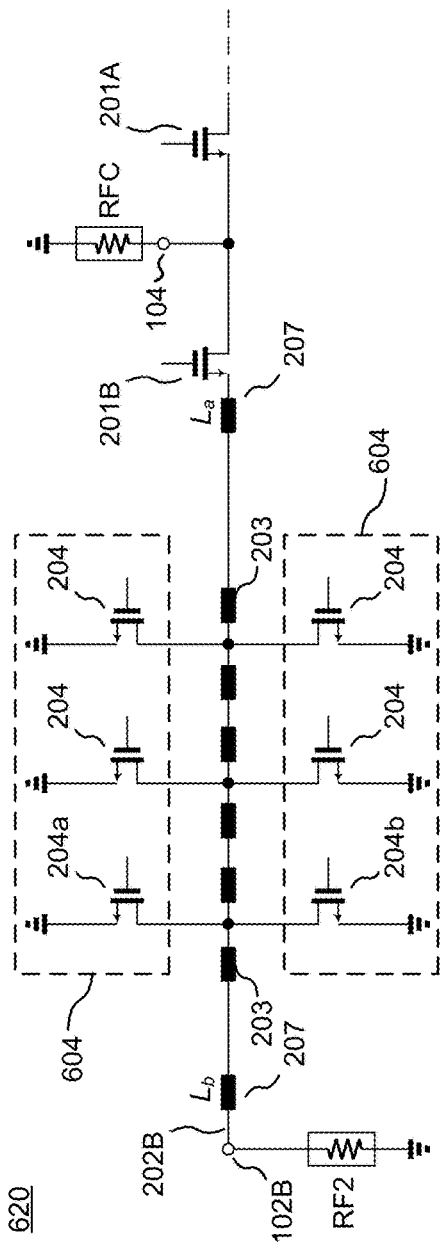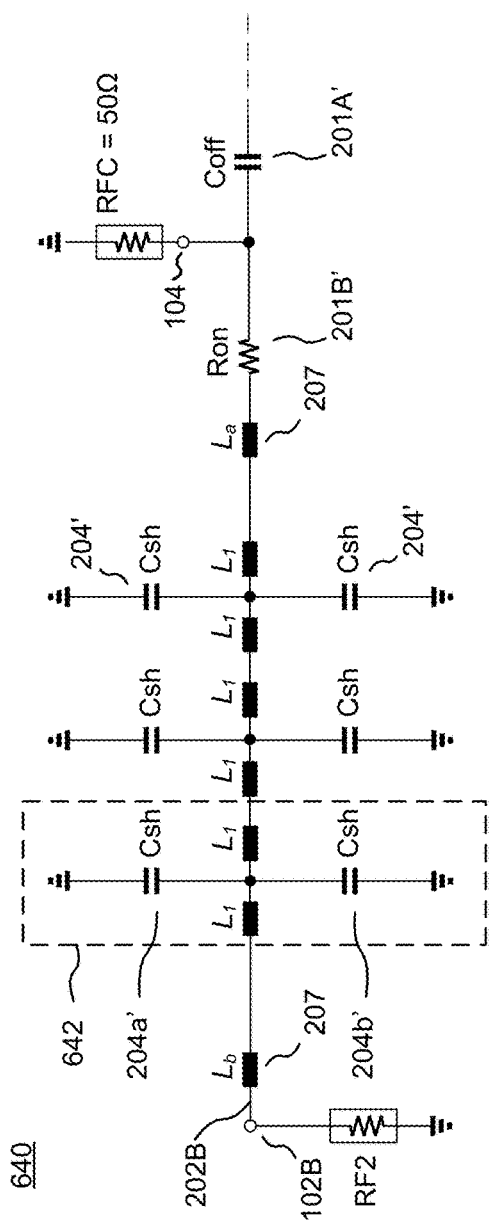
FIG. 6B
FIG. 6C

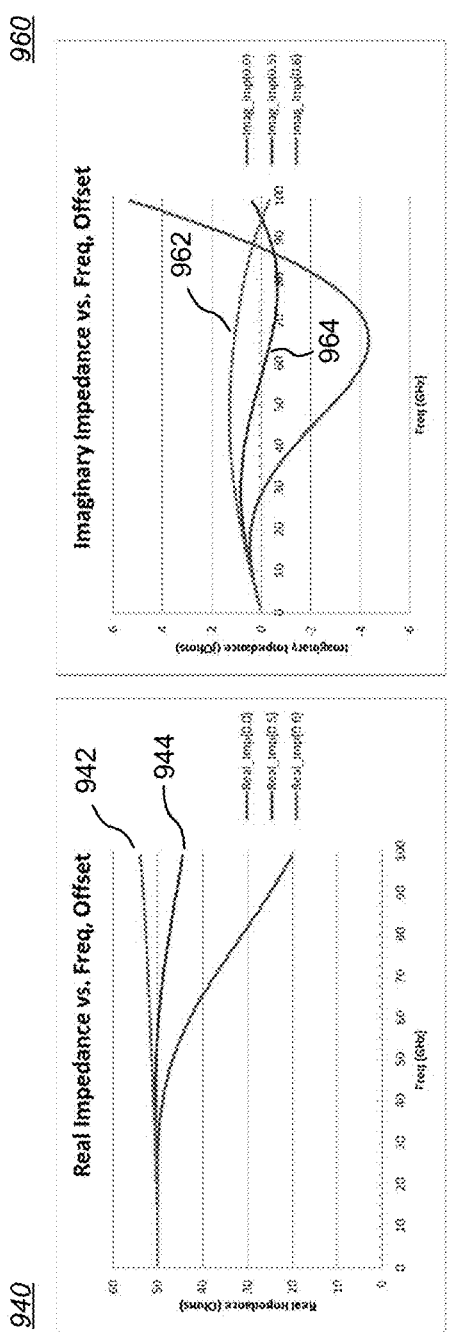
FIG. 9C
FIG. 9D
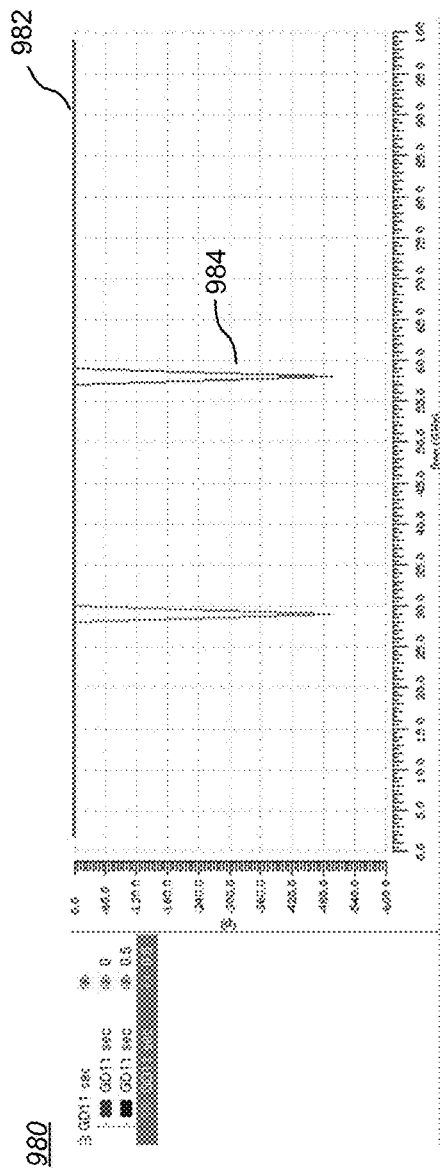
FIG. 9E

RADIO FREQUENCY SWITCHING CIRCUIT WITH DISTRIBUTED SWITCHES

CROSS REFERENCE TO RELATED APPLICATION

Claim of Priority

This application is a continuation-in-part of, and claims priority to, commonly owned and U.S. patent application Ser. No. 15/597,029 filed May 16, 2017, entitled "Radio Frequency Switching Circuit with Distributed Switches", which was a continuation of, and claimed priority to, commonly owned and U.S. patent application Ser. No. 14/995,023, filed Jan. 13, 2016 (now U.S. Pat. No. 9,685,946), which was a continuation-in-part of, and claimed priority to, commonly owned and co-pending U.S. patent application Ser. No. 14/610,588 filed Jan. 30, 2015, entitled "Radio Frequency Switching Circuit with Distributed Switches", the disclosures of which are incorporated herein by reference in their entirety.

BACKGROUND

(1) Technical Field

This invention generally relates to electronic signal switching devices, and more specifically to electronic radio frequency signal switching devices.

(2) Background

Electronic signal switches are used in a wide variety of applications. One type of signal switch in common use is a field effect transistor (FET) that is actively controlled through a gate terminal to block or pass an electrical signal connected in series with source and drain terminals of the FET (in another mode of operation, a FET also may be used to modulate an electrical signal in response to a varying signal on the gate terminal).

Field effect transistors may be fabricated in various technologies (e.g., standard bulk silicon, silicon-on-insulator, silicon-on-sapphire, GaN HEMT, GaAs pHEMT, and MESFET processes) and are commonly represented in schematic diagrams as an idealized device. However, in many applications, particularly in radio frequency (RF) circuits, the structure and materials of a FET switch may have significant effects on its own operation (e.g., with respect to bandwidth, isolation, and power handling) and the presence of a FET switch may have significant effects on other components in a circuit. Such effects arise in part because a "CLOSED"/"ON" (low impedance) FET has a non-zero resistance, and an "OPEN"/"OFF" (high impedance) FET behaves as a capacitor due to parasitic capacitances arising from the proximity of various semiconductor structures, particularly within the close confines of an integrated circuit (IC). Large signal behaviors affecting power handling may also arise from other characteristics of a FET, such as avalanche breakdown, current leakage, accumulated charges, etc. Accordingly, the actual in-circuit behavior of a FET must be taken into account when designing FET based circuitry.

One use of FET switches is within RF frequency signal switching devices. For example, FIG. 1A is a schematic diagram of a prior art 3-port reflective signal switching device 100 for selectively coupling one of two terminal ports 102A, 102B (shown series connected to respective external loads RF1, RF2) to a common port 104 (shown series connected to an external load RFC). Accordingly, the signal switching device 100 may be regarded as a single-pole, double-throw (SPDT) switch. In other configurations, more than two terminal ports (a 1×N switch) and more than one common port may be included (an M×N switch). Between the common port 104 and each terminal port 102A, 102B are respective FET series switches 106A, 106B; the FET series switches 106A, 106B may vary in size, for example, to accommodate different power levels. Between each terminal port 102A, 102B and its respective series switch 106A, 106B are respective FET shunt switches 108A, 108B, coupled to circuit ground. Such a switching device 100 may be used, for example, to selectively couple RF signals between two antennas respectively connected to the terminal ports 102A, 102B and transmit and/or receive circuitry connected to the common port 104. For RF signals, each load/source impedance RF1, RF2, RFC would typically have a nominal impedance of 50 ohms by convention.

In operation, when terminal port 102A is to be coupled to the common port 104, series switch 106A is set to a low impedance ON state by means of control circuitry (not shown) coupled to the gate of the FET series switch 106A. Concurrently, shunt switch 108A is set to a high impedance OFF state. In this state, signals can pass between terminal port 102A and the common port 104.

For the other terminal port 102B, the series switch 106B is set to a high impedance OFF state to decouple the terminal port 102B from the common port 104, and the corresponding shunt switch 108B is set to a low impedance ON state. One purpose of setting the shunt switch 108B to ON—thus coupling the associated terminal port 102B to circuit ground—is to improve the isolation of the associated terminal port 102B (and coupled circuit elements, such as antennas) through the corresponding series switch 106B. For switching devices with more than two terminal ports, the series switch and shunt switch settings for the "unused" (decoupled) terminal port to common port signal paths typically would be set to similar states.

FIG. 1B is a diagram showing an equivalent circuit model of the prior art 3-port signal switching device of FIG. 1A. Shown is a circuit configuration 120 in which terminal port 102A has been coupled to the common port 104; accordingly, series switch 106A and shunt switch 108B are set to a low impedance ON state, while series switch 106B and shunt switch 108A are set to a high impedance OFF state. In this configuration, series switch 106A is modeled as a resistor 126A having a resistance value of Ron (i.e., the CLOSED or ON state resistance of a FET), shunt switch 108A is modeled as a capacitor 128A having a capacitance of Csh (i.e., the OPEN or OFF state capacitance of a FET), series switch 106B is modeled as a capacitor 126B having a capacitance of Coff, and shunt switch 108B is modeled as a resistor 128B having a resistance value of Rsh. As in FIG. 1A, with the illustrated circuit configuration, signals can pass between terminal port 102A and the common port 104.

FIG. 1C is a diagram showing a simplified equivalent circuit model 130 corresponding to the circuit configuration 120 shown in FIG. 1B. Series switch 106B (modeled as a capacitor 126B in FIG. 1B) is OFF. The corresponding shunt switch 108B (modeled as a resistor 128B in FIG. 1B) is ON, thus having a very low impedance and coupling terminal port 102B to circuit ground. Since Rsh has a very low impedance, the resistor equivalent 128B in FIG. 1B may be more simply modeled as a conductor (short) to circuit ground and is thus shown in dotted-line resistor form. Therefore, the two equivalent circuit elements 126B, 128B of FIG. 1B may be modeled as a single capacitor 126B' having a capacitance of Coff. Similarly, since series switch 106A (modeled as a resistor 126A in FIG. 1B) is ON and Ron is a very low impedance, series switch 106A may be more simply modeled as a conductor. Accordingly, the resistor equivalent 126A in FIG. 1B is shown in dotted-line resistor form, leaving OFF shunt switch 108A (modeled as a capacitor 128A with a capacitance of Csh) connected in parallel with the external load RF1. As in FIG. 1A and FIG. 1B, with the illustrated circuit configuration, signals can pass between terminal port 102A and the common port 104, as shown by dotted line signal path 132.

The simplified equivalent circuit model 130 can be used to evaluate the insertion loss (IL) bandwidth of the circuit model 130. In this example, the 3 dB IL bandwidth is proportional to $1/(Rport*(Coff+Csh))$ [where Rport is the load resistance at the RF1 and RFC ports], which is typically limited to below 13 GHz in current silicon IC technology.

The bandwidth of conventional radio frequency switching devices of the type shown in FIGS. 1A, 1B, and 1C is limited by the parasitic capacitance from the Csh equivalent components. This invention in various embodiments addresses this limitation to improve the bandwidth of RF switching devices as well as the signal isolation and power handling of such switching devices.

SUMMARY OF THE INVENTION

Embodiments of the invention use distributed shunt switches distributed along transmission lines (or may include other inductive impedance compensating components) to improve RF bandwidth with respect to insertion loss, and to improve isolation. In addition, the shunt switches may be physically positioned on both sides of the transmission lines to keep an integrated circuit (IC) design essentially symmetrical so as to provide predictable and reliable operational characteristics. Some embodiments include stacked FET shunt switches and series switches to tolerate high voltages. In some embodiments, the gate resistor for each FET shunt switch is divided into two or more portions to save IC area near the transmission lines, or to optimize a performance parameter, such as power handling, isolation, or low frequency behavior.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 4A is a schematic diagram of a circuit architecture having distributed stacked shunt switches as well as distributed gate resistors.

FIG. 4B is a schematic diagram of a circuit architecture having lumped stacked shunt switches.

FIG. 5 is a schematic diagram of a circuit architecture having stacked series switches.

FIG. 6B is a schematic diagram showing the layout of one "arm" of an embodiment of the circuit of FIG. 6A, illustrating the bracketing symmetrical layout in greater detail.

FIG. 6C is a schematic diagram showing an equivalent circuit model and layout of the circuit of FIG. 6B when the common port is coupled to the terminal port.

FIG. 9C is a graph showing real impedance as a function of frequency for offset ratios 0, 0.5, and 0.6 in a modeled RF switch circuit of the type shown in FIGS. 6A and 7C.

FIG. 9D is a graph showing imaginary impedance as a function of frequency for offset ratios 0, 0.5, and 0.6 in a modeled RF switch circuit of the type shown in FIGS. 6A and 7C.

FIG. 9E is a graph showing Group Delay as a function of frequency in a modeled RF switch circuit of the type shown in FIGS. 6A and 7C.

Like reference numbers and designations in the various drawings indicate like elements.

DETAILED DESCRIPTION OF THE INVENTION

Figure 1A:
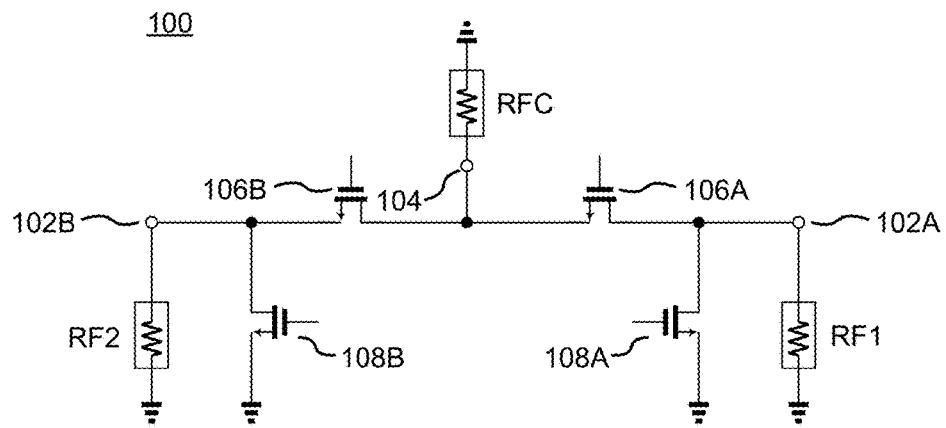
FIG. 1A is a schematic diagram of a prior art 3-port reflective signal switching device for selectively coupling one of two terminal ports to a common port.
Figure 1B:
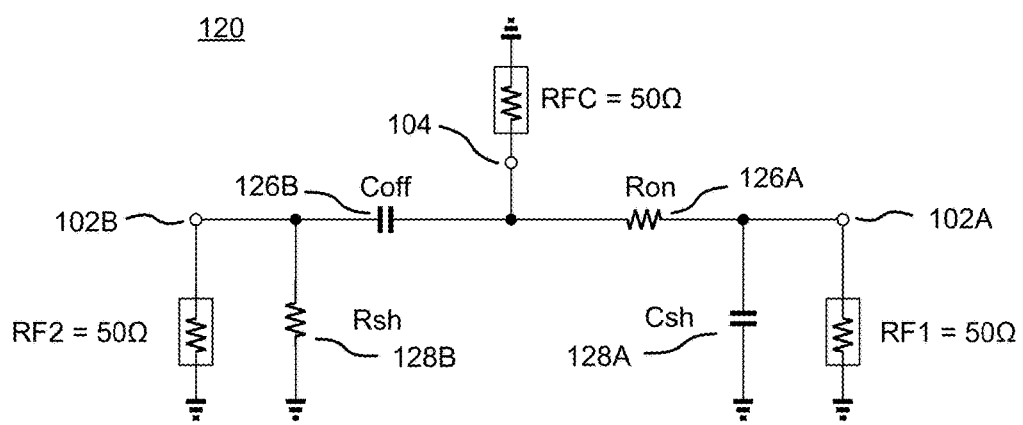
FIG. 1B is a diagram showing an equivalent circuit model of the prior art 3-port signal switching device of FIG. 1A.
Figure 1C:
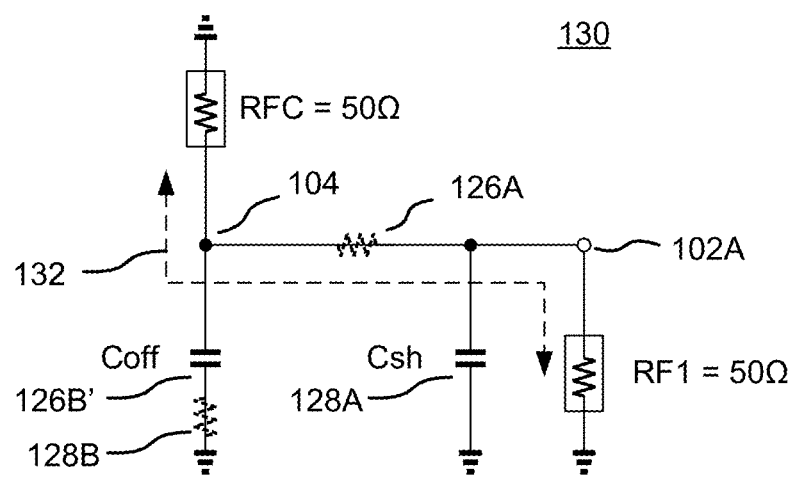
FIG. 1C is a diagram showing a simplified equivalent circuit model corresponding to the circuit configuration shown in FIG. 1B.

The bandwidth of conventional radio frequency (RF) switching devices of the type shown in FIGS. 1A, 1B, and 1C is limited primarily by the parasitic capacitance from the Csh equivalent component and from the Coff equivalent component. Embodiments of the invention use distributed shunt switches distributed along transmission lines (or may include other inductive impedance compensating components) to improve RF bandwidth with respect to insertion loss, and to improve isolation. In addition, the shunt switches may be physically positioned on both sides of the transmission lines to keep an integrated circuit (IC) design essentially symmetrical so as to provide predictable and reliable operational characteristics. Some embodiments include stacked FET shunt switches and series switches to tolerate high voltages. In some embodiments, the gate resistor for each FET shunt switch is divided into two or more portions to save IC area near the transmission lines, or to optimize a performance parameter, such as power handling, isolation, or low frequency behavior.

Distributed Shunt Switches

Figure 2A:
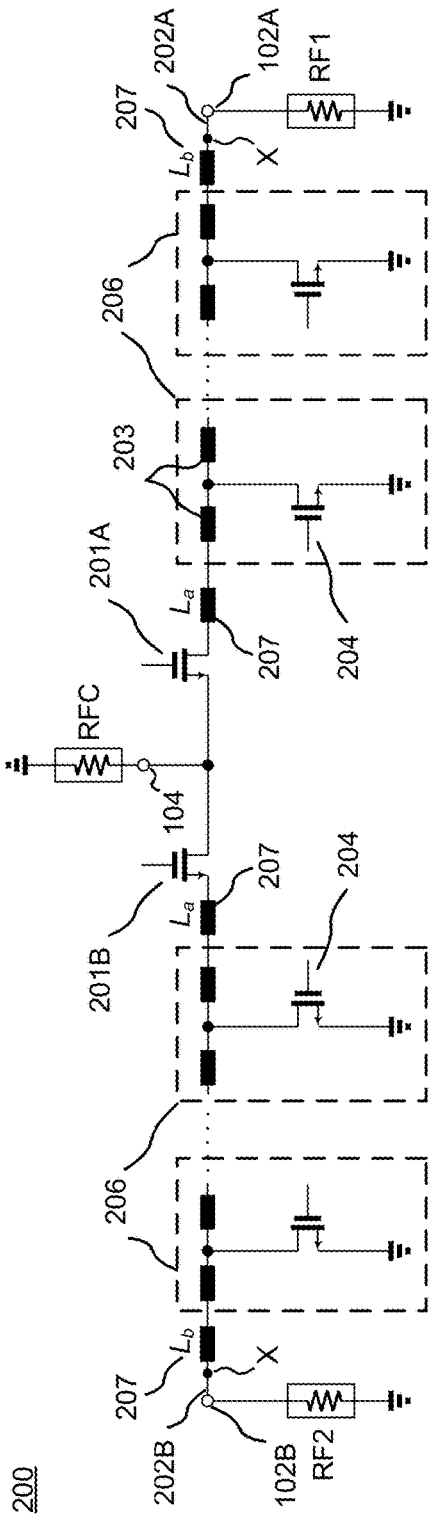
FIG. 2A is a schematic diagram of a 3-port signal switching device for selectively coupling one of two terminal ports to a common port in accordance with the teachings of this disclosure.

FIG. 2A is a schematic diagram of a 3-port signal switching device 200 for selectively coupling one of two terminal ports 102A, 102B (shown series connected to respective external loads RF1, RF2) to a common port 104 (shown series connected to an external load RFC) in accordance with the teachings of this disclosure. Accordingly, the illustrated signal switching device 200 may be regarded as a single-pole, double-throw (SPDT) switch.

Between the common port 104 and each terminal port 102A, 102B are respective primary isolation FET series switches 201A, 201B that operate in essentially the same fashion as the corresponding series switches 106A, 106B in FIG. 1A. In other configurations, only one terminal port may be used (e.g., only terminal port 102A in a single-pole, single-throw switch), more than two terminal ports may be included (e.g., a 1×N switch), and more than one common port may be included (e.g., an M×N matrix switch). When three or more terminal ports are included (e.g., 102A, 102B, and a similar third port not shown), the switching device 200 may be utilized as a transfer switch, allowing a signal to be communicated from any one port to any other port while isolating unused ports from the signal path (the common port 104 is not used in such a case unless an isolation serial switch to the signal path is interposed). Further, the FET series switches 201A, 201B may be of different sizes in some embodiments. The illustrated embodiment may be advantageously embodied on a silicon-on-insulator (SOI) integrated circuit (IC) substrate.

An important aspect of the disclosed embodiments is that inductive tuning components are included to compensate for the OFF state capacitance Csh of the shunt switch units 204 described below. One way to provide such inductive tuning components is to use a transmission line that includes at least one series inductive component coupled to at least one shunt capacitive component. In the embodiment illustrated in FIG. 2A, each of the FET series switches 201A, 201B is coupled to a corresponding transmission line 202A, 202B that can be modeled as a plurality of series-coupled inductive tuning components 203 (depicted as rectangular symbols in this example). Each transmission line 202A, 202B may be implemented, for example, as microstrips or coplanar waveguides. For RF switching devices, the transmission lines 202A, 202B would typically be tuned to have a nominal impedance of 50 ohms by convention. The individual shunt switches 108A, 108B shown in FIG. 1A have each been replaced by sets of n (where n≥1) parallel FET shunt switch units 204. The shunt switch units 204 may be reduced in size compared to a conventional single shunt switch 108A, 108B.

Figure 2C:
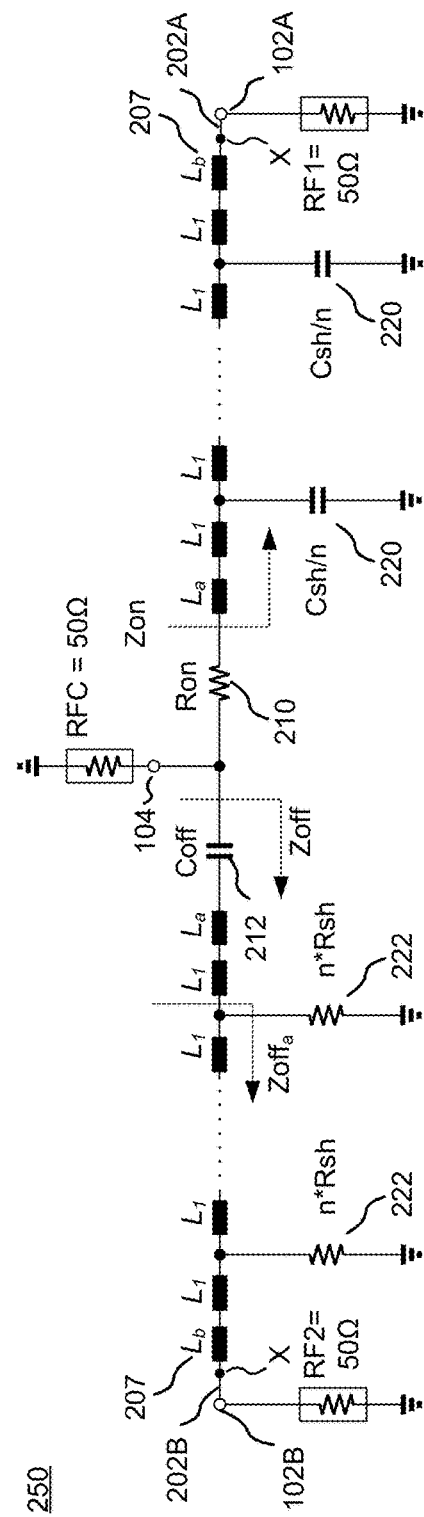
FIG. 2C is a diagram showing an equivalent circuit model of the 3-port signal switching device of FIG. 2A.
Figure 2B:
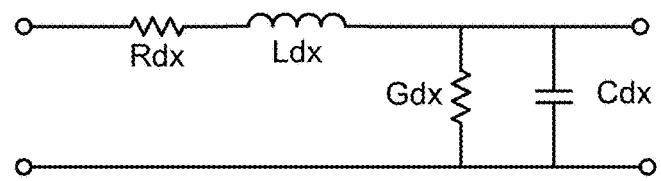
FIG. 2B is a schematic representation of an elemental length of a transmission line.

FIG. 2B is a schematic representation of an elemental length of a transmission line, where Rdx, Ldx, Gdx, and Cdx, are respectively, the per unit length resistance, inductance, conductance, and capacitance of the line. The impedance Zo of such a transmission line is $Zo=\sqrt{(Ldx/Cdx)}$. The OFF state capacitance Csh of the shunt switches units 204 is in parallel with Cdx. To achieve compensation of Csh of the shunt switches units 204, Ldx can be increased, or Cdx can be decreased, or both, with respect to each other, so that $\sqrt{(Ldx/(Cdx+Csh))}=Zo$ (commonly specified as 50 ohms by convention).

In the illustrated embodiment, the conduction (source-drain) channel of each FET shunt switch unit 204 is coupled to circuit ground and between a corresponding pair of inductive tuning components 203, thereby forming an elemental length of a transmission line 206, examples of which are shown bounded by dotted boxes. In some embodiments, an inductive tuning component 203 may be shared between adjacent shunt switch units 204, thus constituting part of two elemental lengths of a transmission line. However, for purposes of circuit analysis, it may be easier to model a shared inductive tuning component 203 as being "split" between adjacent shunt switch units 204.

As more fully explained below, the primary series switches 201A, 201B and the shunt switch units 204 may be replaced by multiple series-coupled FET switches to tolerate higher voltages than a single FET switch. Such "stacking" of FET switches helps decrease the effective Csh while permitting higher power handling.

Additional supplemental inductive tuning components 207 (also labeled $L_a$ and $L_b$) may be added at either end or both ends of the transmission lines 202A, 202B to enable fine tuning of parasitics unrelated to the transmission lines 202A, 202B, such as the series switch device parasitic capacitances and pad capacitance for I/O interconnects. The values for the supplemental inductive tuning components 207 ($L_a$, $L_b$) of one transmission line may be the same or different with respect to each other, and with respect to the supplemental inductive tuning components 207 ($L_a$, $L_b$) of other transmissions lines. In addition, in some applications, it may be useful to insert an additional secondary isolation series FET switch in series with the transmission line signal path at each node marked "X" in FIG. 2A and FIG. 2C, making the circuit appear more symmetrical electrically. By opening the primary and secondary series FET switches at both ends of a transmission line (e.g., 202B) associated with an unused terminal port (e.g., 102B), that transmission line will be fully isolated from any circuitry attached to such ends. The secondary isolation series FET switches may be the same size as the primary isolation series switches 201A, 201B, but equal sizing is not required to still provide benefit. For example, modeling has shown that there may be a benefit to having different sizes for the secondary isolation series FET switches relative to the primary isolation series FET switches. In general, adding secondary isolation series FET switches would most frequently apply to switching devices having two or more terminal ports, but may also be applied to switching devices having a single terminal port (e.g., a SPST switch) when there may be some aspect of the external circuit element being switched where having more isolation on both sides of the transmission line signal path is helpful (e.g., when using an SPST embodiment in a shunt configuration to circuit ground).

In operation, when terminal port 102A is to be coupled to the common port 104, series switch 201A is set to a low impedance ON state by means of control circuitry (not shown) coupled to the gate of the FET series switch 201A. Concurrently, the set of n shunt switch units 204 coupled to transmission line 202A is set to a high impedance OFF state. In this state, signals can pass between terminal port 102A and the common port 104 along transmission line 202A.

For the other terminal port 102B in this example, the series switch 201B is set to a high impedance OFF state to decouple transmission line 202B and the terminal port 102B from the common port 104, and the set of n corresponding shunt switch units 204 coupled to transmission line 202B is set to a low impedance ON state, thus coupling the associated terminal port 102B to circuit ground.

FIG. 2C is a diagram showing an equivalent circuit model of the 3-port signal switching device of FIG. 2A. Shown is a circuit configuration 250 in which terminal port 102A has been coupled to the common port 104, as described with respect to FIG. 2A. In this configuration, series switch 201A is modeled as a resistor 210 having a resistance value of Ron, and series switch 201B is modeled as a capacitor 212 having a capacitance of Coff. The shunt switch units 204 coupled to transmission line 202A are each shown modeled as capacitances 220 with a capacitance of Csh/n. The shunt switch units 204 coupled to transmission line 202B are each shown modeled as resistances 222 with a resistance of Rsh*n.

As in FIG. 2A, with the illustrated circuit configuration 250, signals can pass between terminal port 102A and the common port 104. For RF signals, each load RF1, RF2, RFC would typically have a nominal impedance of 50 ohms by convention. Each of the inductive tuning components 203, 207 in FIG. 2A has a corresponding inductance, $L_a$, $L_b$, or $L_1$, as shown in FIG. 2C and described below. Values for the inductive tuning components 203 may be selected to achieve compensation of Csh of the shunt switches units 204 as described above. Values for the supplemental inductive tuning components 207 ($L_a$, $L_b$) may be selected to achieve compensation of Coff and the impedance (Zoff$_a$, described below) of the OFF signal path, and for parasitics associated with signal interconnections.

Benefits of the embodiment illustrated in FIG. 2A and FIG. 2C include (1) tuning out the effect of Coff; (2) tuning out the effect of Csh; and (3) improving isolation of OFF paths.

(1) Tuning out the Effect of Coff

For the configuration shown in FIG. 2A, the impedance Zoff of the OFF path (i.e., all of the elements from series switch 201B through load RF2, as indicated by the dotted "Zoff" line in FIG. 2C) is given by the following formula:

$$Zoff = j\omega(L_a + L1) + 1/j\omega Coff + Zoff_\alpha \quad [\text{Eq. 1}]$$

where Zoff$_a$ comprises the impedance of the OFF path after the first $L_1$ inductive tuning component through load RF2 (as indicated by the dotted "Zoff$_a$" line in FIG. 2C) and whose value approaches n*Rsh at higher frequencies.

The resonant frequency of the Zoff impedance is $$\frac{1}{2\pi\sqrt{(L_a + L_1)Coff}}.$$

When Zoff is below its resonant frequency $$\left(\text{i.e., } jw(L_a + L_1) < \left|\frac{1}{j\omega Coff}\right|\right),$$

achieved by selection of the values for the inductive tuning components 203 for a particular application, then the loading effect of the Coff capacitance on the ON path (i.e., all of the elements from series switch 201A through load RF1) is appreciably reduced, thus improving the bandwidth of the switching device 200 compared with conventional designs. This characteristic can be used to improve the design trade-off between bandwidth, insertion loss, and isolation for all such switching devices.

(2) Tuning out the Effect of Csh

For the configuration shown in FIG. 2A, with respect to the ON path, the impedance Zon for the ON path (as indicated by the dotted "Zon" line) is given by the following formula:

$$Zon = \sqrt{\frac{2*L_1}{Cshunt/n}} \quad [\text{Eq. 2}]$$

The cutoff frequency (half power point), $f_c$, is given by the following formula:

$$f_c = \frac{1}{2\pi\sqrt{2*L_1*\frac{Cshunt}{n}}} \quad [\text{Eq. 3}]$$

Figure 3:
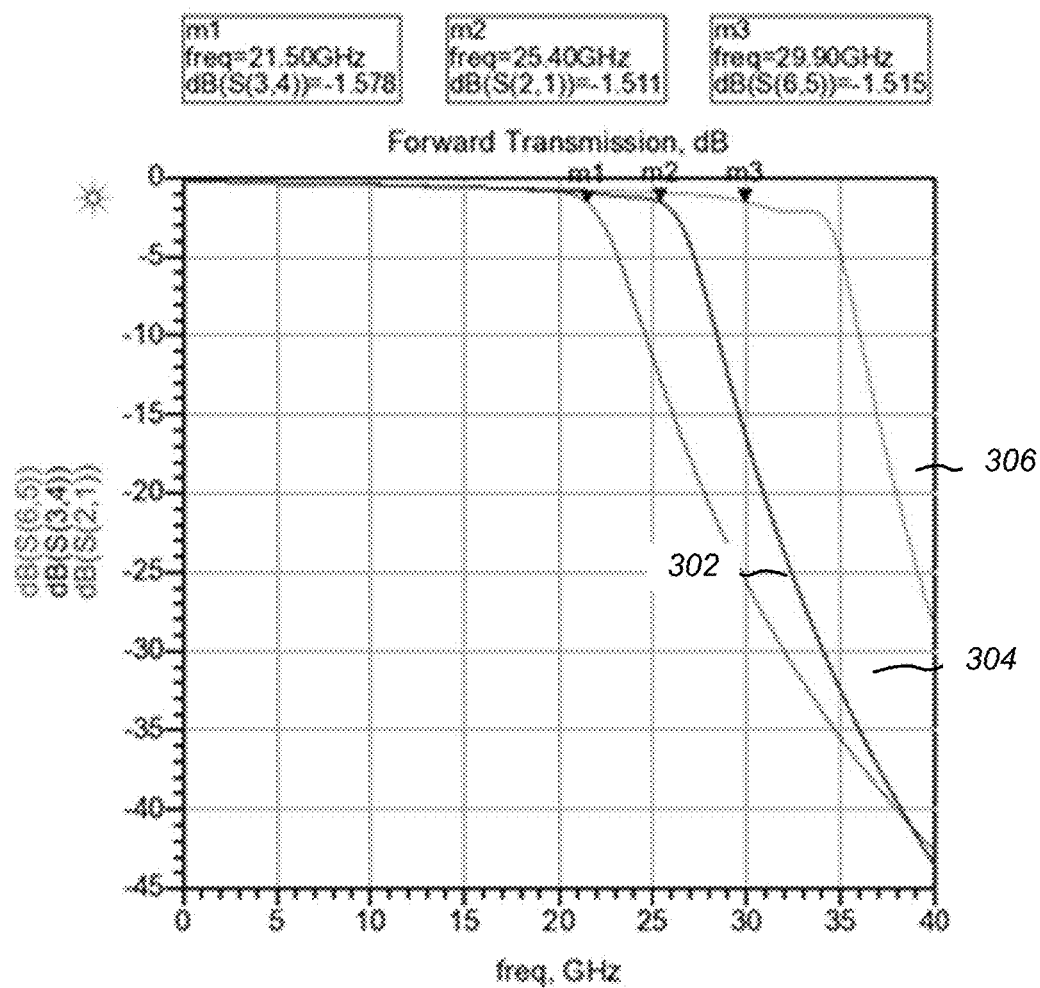
FIG. 3 is a graph showing simulation results of three variations of a switching device in accordance with FIG. 2A.

Accordingly, the half power point (3 dB) bandwidth of Zon is related to $L_1$, n, and Csh, and can be adjusted by adding additional tuning network stages 206 (i.e., increasing n). The corresponding value of $L_1$ is then determined by Eq. 2 to maintain a constant Zon. As deduced from Eq. 2, as n is increased, the corresponding value of $L_1$ is decreased proportional to 1/n. In particular, the higher the number n of tuning networks 206, the higher the cutoff frequency. For example, FIG. 3 is a graph showing simulation results of three variations of a switching device in accordance with FIG. 2A, with n=4, 5, or 6 while keeping the total transmission line 202A length and the total Csh capacitance the same. Utilizing a more conservative power point before insertion loss begins to significantly decline, the 1.5 dB bandwidth (indicated by corresponding markers m1, m2, and m3) for the three circuit variations improved from 21.5 GHz (n=4, see line 302) to 25.4 GHz (n=5, see line 304) to 29.9 GHz (n=6, see line 306) as n increased.

Further, working with equations Eq. 2 and Eq. 3, the value of Csh can be expressed in terms of the desired Zon, $f_c$, and number of networks n as follows:

$$Cshunt = \frac{n}{2\pi f_c * Zon} \quad [\text{Eq. 4}]$$

Therefore, the maximum Csh can be calculated for a set of targeted parameters. As an example, for a Zon of 50 Ohms, a cutoff frequency of 60 GHz, and n=6 for the number of tuning networks 206, results in Csh=318 fF, Csh/n=53 fF, and $L_1$=66 pH.

(3) Improving Isolation of OFF Paths

For the configuration shown in FIG. 2A, as noted above, the higher the number n of shunt switch units 204 and corresponding inductive tuning components 203 (i.e., tuning networks 206), the higher the cutoff frequency. In addition, as n increases, the higher the number of LR low pass filter stages there are in the OFF path, and accordingly the isolation of the OFF path (from RFC to RF2) is improved compared to conventional designs.

Stacked Switch Structures

As mentioned above, each of the shunt switch units 204 and the series switches 201A, 201B may be replaced by multiple series-coupled FET switches. This type of "stacked" architecture allows a circuit to tolerate higher voltages than a single FET switch. For example, FIG. 4A is a schematic diagram of a circuit architecture having distributed stacked shunt switches as well as distributed gate resistors (the distributed gate resistor aspect is discussed below). In this example, each of the n shunt switch units 204 of FIG. 2A has been replaced by a series-coupled stack of m FET switches 402, where m≥2.

For some embodiments that may not require distributed shunt switches, a lumped design with stacked shunt switches may be used. For example, FIG. 4B is a schematic diagram of a circuit architecture having lumped stacked shunt switches. In this example, the n shunt switch units 204 of FIG. 2A has been replaced by a single series-coupled stack of m FET switches 404.

The series switches 201A, 201B shown in FIG. 2A may also be implemented as stacked switches. For example, FIG. 5 is a schematic diagram of a circuit architecture 500 having stacked series switches. One or more of the series switches 201A, 201B shown in FIG. 2A would be replaced by two or more FET switches 502 configured as a series-coupled stack.

Bracketing Symmetrical Layout Embodiments

The switching device architecture shown in FIG. 2A can be advantageously combined with the stacked switch circuits shown in FIG. 4A, FIG. 4B, and/or FIG. 5 to provide a distributed stacked FET-switch based switching device that provides for approximately even electromagnetic field distribution around the transmission lines 202A, 202B, and provides for a better ground return.

Figure 6A:
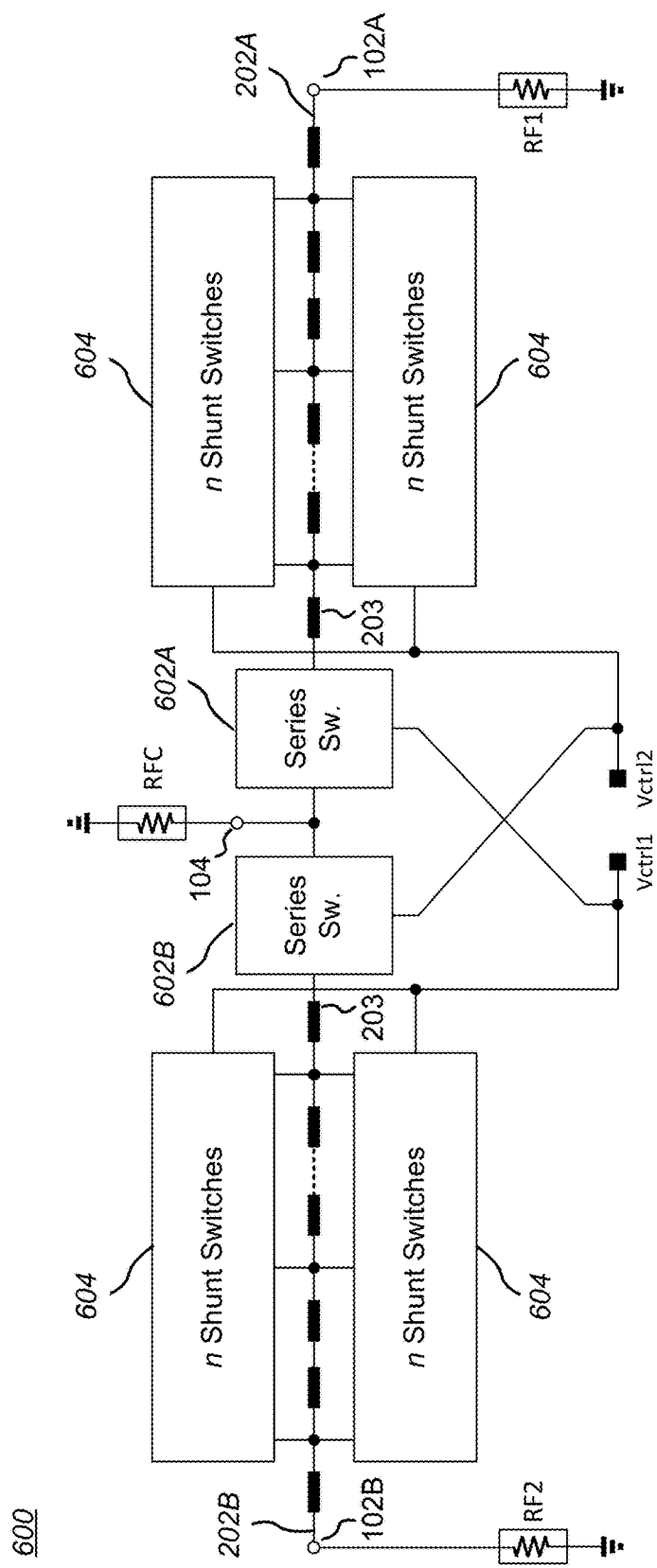
FIG. 6A is a diagram of a stylized circuit layout of an RF switching circuit with distributed stacked switches for both the shunt and series switch components.

For example, FIG. 6A is a diagram of a stylized circuit layout of an RF switching circuit 600 with distributed switches (which may be stacked switches) for both the shunt and series switch components. In the illustrated embodiment, two terminal ports 102A, 102B (shown series connected to respective external loads RF1, RF2) are connectable to a common port 104 (shown series connected to an external load RFC) through corresponding transmission lines 202A, 202B and series switches 602A, 602B. The series switches 602A, 602B may be single FET switches as shown in FIG. 2A, or a stack of FET switches as shown in FIG. 5. As in FIG. 2A and FIG. 2C, the transmission lines 202A, 202B each include a plurality of inductive tuning components 203, and, optionally, supplemental inductive tuning components 207 (not shown).

Coupled to the transmission lines 202A, 202B are sets of n shunt switches 604, each of which may be configured as shown in FIG. 2A (distributed), FIG. 4A (stacked distributed), or FIG. 4B (lumped distributed); in each configuration, there is an internal connection to circuit ground (not shown in FIG. 6A). As discussed above, a configuration with n shunt switch units alone or in conjunction with control of the inductance values of the inductive tuning components 203, 207 gives control over the cutoff frequency of the switching circuit 600, provides the ability to tune out the effects of Csh and Coff, and improves isolation of OFF paths. In addition, by using a stack of m FET switches for each of the n shunt switch units, higher voltage levels can be tolerated.

Importantly, in the configuration shown in FIG. 6A, the sets of shunt switches 604 are physically placed on both sides of the transmission lines 202A, 202B, and the transmission lines 202A, 202B are arrayed on an IC layout in a substantially symmetrical manner. Such placement of the sets of shunt switches 604 provides for approximately even electromagnetic field distribution around the transmission lines 202A, 202B and provides for a better ground return because of the multiple connections to circuit ground; both characteristics are useful when designing absorptive switches. In addition, such physical distribution improves the thermal characteristics of the switching device 600 by spacing apart the FET switches, thus reducing the areal concentration of power-consuming circuit elements.

As noted above, in other configurations, only one terminal port may be used (e.g., a single-pole, single-throw switch), more than two terminal ports may be included (e.g., a 1×N switch), and more than one common port may be included (e.g., an M×N matrix switch). Accordingly, fewer or additional transmission lines may be arrayed on an IC layout in a substantially symmetrical manner as needed to accommodate fewer or additional ports, with associated sets of shunt switches 604 physically placed on both sides of the added transmission lines.

As noted, the sets of n shunt switches 604 shown in FIG. 6A bracket corresponding transmission lines 202A, 202B laterally in a substantially symmetrical manner. FIG. 6B is a schematic diagram 620 showing the layout of one "arm" of an embodiment of the circuit of FIG. 6A, illustrating the bracketing symmetrical layout in greater detail. In the illustrated example, which shows an arm of transmission line 202B from the common port 104 to terminal port 102B, the shunt switch units 204 of each set of n shunt switches 604 are paired with corresponding shunt switch units 204 of another set of n shunt switches 604 on the opposite lateral side of the transmission line 202B, thus bracketing the sides of the transmission line arm 202B. For example, shunt switch units 204a and 204b laterally bracket the transmission line 202B.

FIG. 6C is a schematic diagram 640 showing an equivalent circuit model and layout of the circuit of FIG. 6B when the common port 104 is coupled to the terminal port 102B. In this configuration, series switch 201B of FIG. 6B is ON and modeled as a resistor 201B' having a resistance value of Ron, and series switch 201A of FIG. 6B is OFF and modeled as a capacitor 201A' having a capacitance of Coff. The shunt switch units 204, 204a, and 204b, coupled to transmission line 202B, are in an OFF state, and accordingly each is shown modeled as a capacitance 204', 204a', 204b'. The bracketing symmetry of the shunt switch unit capacitances 204a', 204b' around the transmission line 202B is shown diagrammatically within the dashed box 642.

Figure 6D:
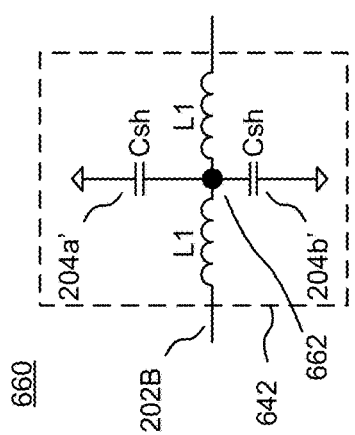
FIG. 6D is a schematic diagram showing an equivalent circuit model of one set of paired FETs bracketing a transmission line and in an OFF state.

FIG. 6D is a schematic diagram 660 showing an equivalent circuit model of one set of paired FETs bracketing a transmission line and in an OFF state. In this model, the shunt switch units 204a, 204b of FIG. 6B are modeled as capacitances Csh 204a', 204b' (as in FIG. 6C) coupled to circuit ground, while the influencing sections of the transmission line 202B of FIG. 6C are modeled as a pair of lumped element inductors L1. As shown, the capacitances Csh 204a', 204b' are arrayed on the lateral sides of the transmission line 202B and connected to essentially a common junction 662 on the transmission line 202B.

Gate Resistance Area Reduction

In general, FET switches require a gate resistor to limit the instantaneous current that is drawn when the FET is turned on, to control the switch ON and OFF times, and in general to maintain electromagnetic integrity. In conventional IC FET designs, a gate resistor is physically located in close proximity to the gate of the transistor. However, when implementing a distributed shunt switch of the type shown in FIG. 4A, each FET shunt switch unit 204 is n times smaller than in a lumped design. Accordingly, to maintain the same low frequency characteristics, the gate resistor value for each FET shunt switch unit 204 must be n times larger than in a lumped design. Further, each FET shunt switch unit 204 may include m FET switches 402. In such a configuration, since there are m stacked elements per shunt switch unit 204, the total size for all of the gate resistors is m*n times bigger in area than in a lumped design.

To reduce the total size of the needed gate resistance, in some embodiments a FET gate resistor can be split into two sections. Referring again to FIG. 4A, each of the FET switches 402 includes a small primary resistance R1 (e.g., about from 1,000 to 1,000,000 ohms) that is placed in close proximity to the gate of each FET to take care of needed electromagnetic integrity. A larger secondary resistance R2 (e.g., about from 10,000 to 10,000,000 ohms) is then placed on a common path series coupled to multiple instances of the small primary resistance R1 (e.g., each of the n FET shunt switch units 204) to maintain desired low frequency characteristics, but may be physically located away from close proximity to the small primary resistances R1 (and hence from the gate of each FET). The values for R1 and R2 are set such that R1/n+R2=R, where R is the total gate resistance needed for a particular circuit design. Such values may be empirically determined by experiment or simulation for frequencies of interest. Because the larger secondary resistances R2 are shared over a number of FET switches, the total area needed for integrated circuit fabrication will be reduced in scale by the ratio of R1 to R2. As should be apparent, each primary resistance R1 and secondary resistance R2 may comprise two or more actual resistive elements.

Bracketing Asymmetric Layout Embodiments

The equivalent circuit model shown in FIG. 6D illustrated that the capacitances Csh symmetrically arrayed on the lateral sides of the transmission line 202B and representing FETs (or FET stacks) in an OFF state are aligned and connected to essentially a common junction 662 on the transmission line 202B. However, in some embodiments, shunt switch units 204a, 204b of FIG. 6B (shown as equivalent OFF-state capacitances 204a', 204b' in FIG. 6D) need not be connected to a common junction along the associated transmission line. Some additional design flexibility is available in such "non-aligned" or offset embodiments.

Figure 7A:
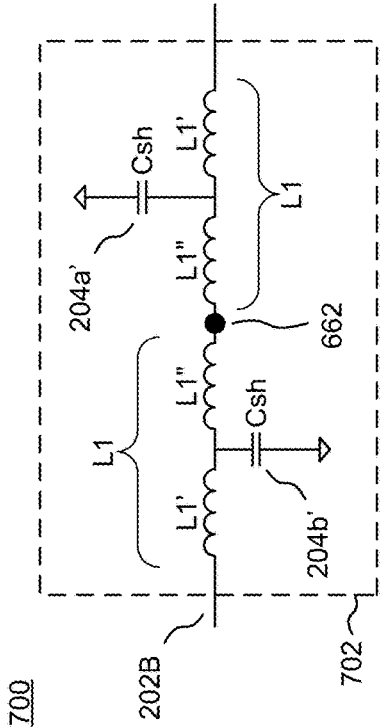
FIG. 7A is a schematic diagram showing an equivalent circuit model of one set of offset paired shunt switch units from FIG. 6B laterally bracketing a transmission line and in an OFF state, and thus represented as capacitances.

For example, FIG. 7A is a schematic diagram 700 showing an equivalent circuit model of one set 702 of offset paired shunt switch units 204a, 204b from FIG. 6B laterally bracketing a transmission line 202B and in an OFF state, and thus represented as capacitances 204a', 204b'. The connection junctions to the transmission line 202B of the shunt switch capacitances 204a', 204b' of a set 702 have been offset from the common junction 662 of FIG. 6D such that a section of the transmission line 202B is interposed between and shared by the connection junctions (remembering that the transmission line 202B, while generally illustrated as a set of lumped inductive elements in the various figures, is actually a continuous inductive element). As above, for purposes of circuit analysis, it is easier to model a shared inductive element as being "split" between adjacent shunt switch capacitances 204a', 204b'. Accordingly, the segment of the transmission line 202B between the shunt switch capacitances 204a', 204b' can be modeled as two inductors having value L1". The segment of the transmission line 202B on the other side of each shunt switch capacitance 204a', 204b' can be modeled as two inductors having value L1'.

Figure 7B:
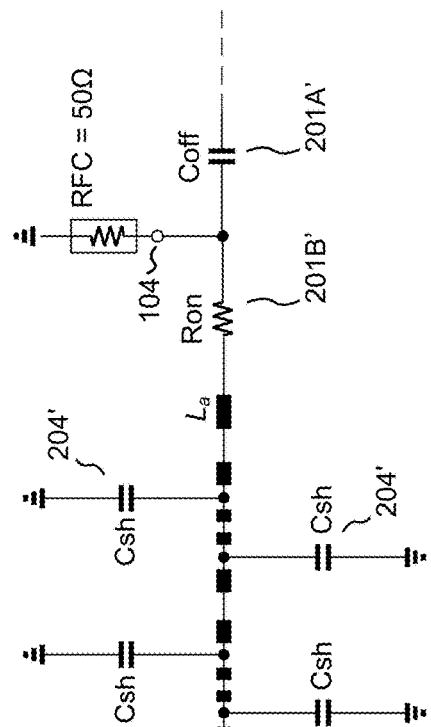
FIG. 7B is a schematic diagram showing an equivalent circuit model and layout of one "arm" of an embodiment of the circuit of FIG. 6A, but with sets of offset shunt switch units (only one set is bounded by a dashed box to avoid clutter).

Note that L1'+L1"=L1, but that L1' need not equal L1", meaning that the amount of offset of each shunt switch capacitance 204a', 204b' is a design choice. For example, FIG. 7B is a schematic diagram 720 showing an equivalent circuit model and layout of one "arm" of an embodiment of the circuit of FIG. 6A, but with sets 702 of offset shunt switch capacitances 204a', 204b' (only one set is bounded by a dashed box to avoid clutter). The illustrated configuration is similar to FIG. 6C, except that the connection junctions of paired OFF-state shunt switch units (represented by capacitances Csh) are offset from each other along the transmission line 202B. As visually depicted, the size of the lumped representation of L1' is larger than the size of the lumped representation of L1".

Figure 7C:
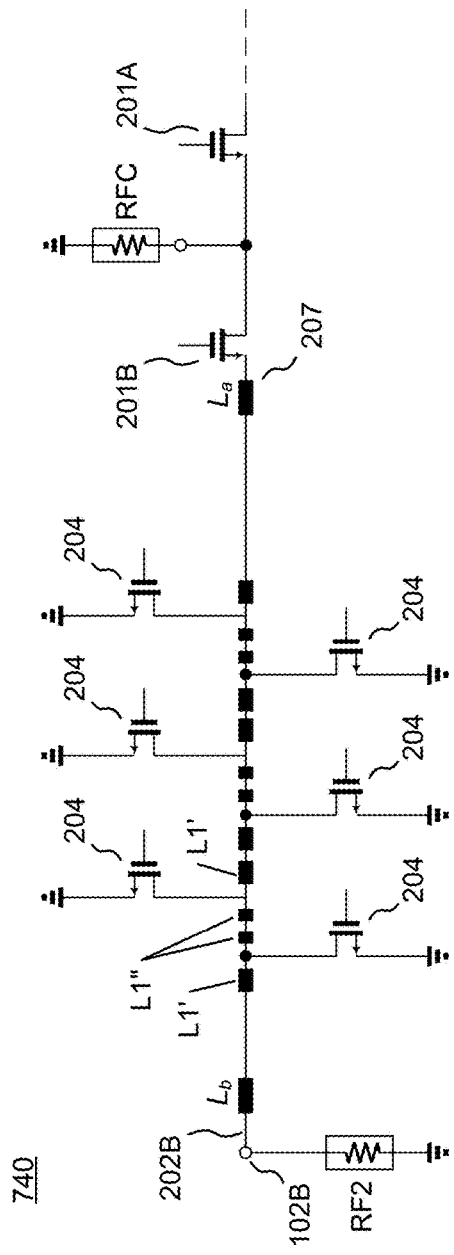
FIG. 7C is a schematic diagram showing a circuit and layout of the equivalent circuit model of FIG. 7B, with each shunt switch unit represented as a FET (a FET stack may also be used).

FIG. 7C is a schematic diagram 740 showing a circuit and layout of the equivalent circuit model of FIG. 7B, with each shunt switch unit 204 represented as a FET (a FET stack may also be used). Again, the size of the lumped representation of L1' is visually depicted as being larger than the size of the lumped representation of L1".

Figure 7D:
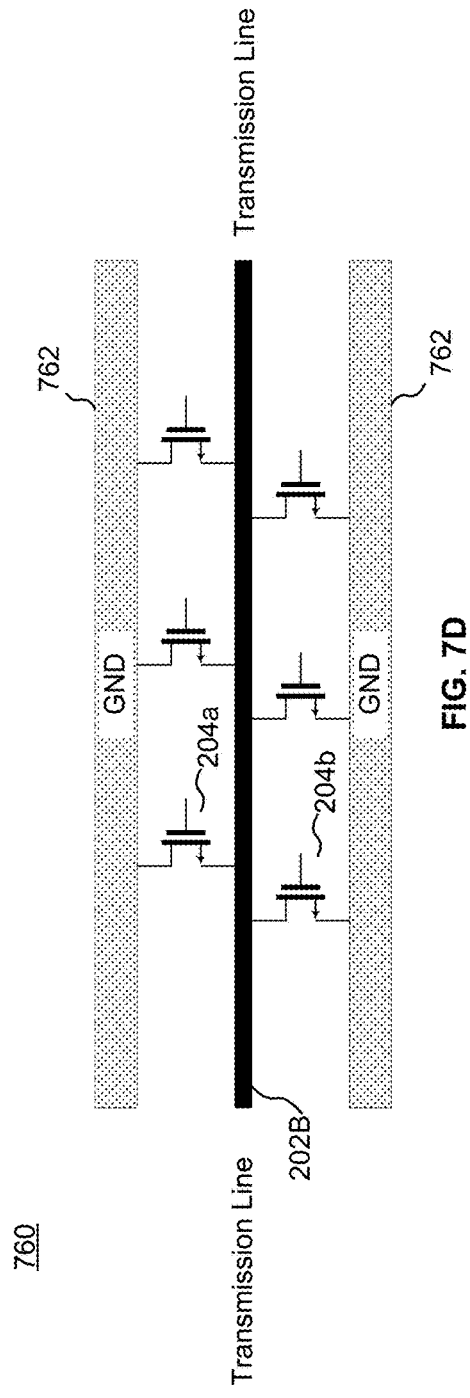
FIG. 7D is a hybrid schematic and layout depiction of the transmission line and shunt switch units of FIG. 7C.

FIG. 7D is a hybrid schematic and layout depiction of the transmission line 202B and shunt switch units 204 of FIG. 7C. The transmission line 202B is shown as a continuous strip that is laterally bracketed by ground strips 762. Pairs of shunt switch units 204a, 204b represented as a FETs are shown connected between the transmission line 202B and associated ground strips 762 (only one pair of shunt switch units 204a, 204b is numbered to avoid clutter). Note that the relative offset of pairs of shunt switch units 204a, 204b along the transmission line 202B can vary from zero (i.e., L1"=0, which would be the aligned embodiment shown in FIG. 6B) to 50% (i.e., L1"=L1', which would be an embodiment in which a shunt switch unit 204 on one lateral side of the transmission line 202B is joined to the transmission line 202B halfway between adjacent shunt switch units 204 on the other lateral side of the transmission line 202B) to 100% (i.e., L1'=0, which would be an embodiment in which a first shunt switch unit 204 on one lateral side of the transmission line 202B is joined to the transmission line 202B essentially aligned with a second, adjacent shunt switch unit 204 on the other lateral side of the transmission line 202B). Thus, the offset ratio of L' to L" (or, equivalently, of two FET shunt switch units on opposing lateral sides of the transmission line 202B) may vary from 0 to 1.0.

Figure 8:
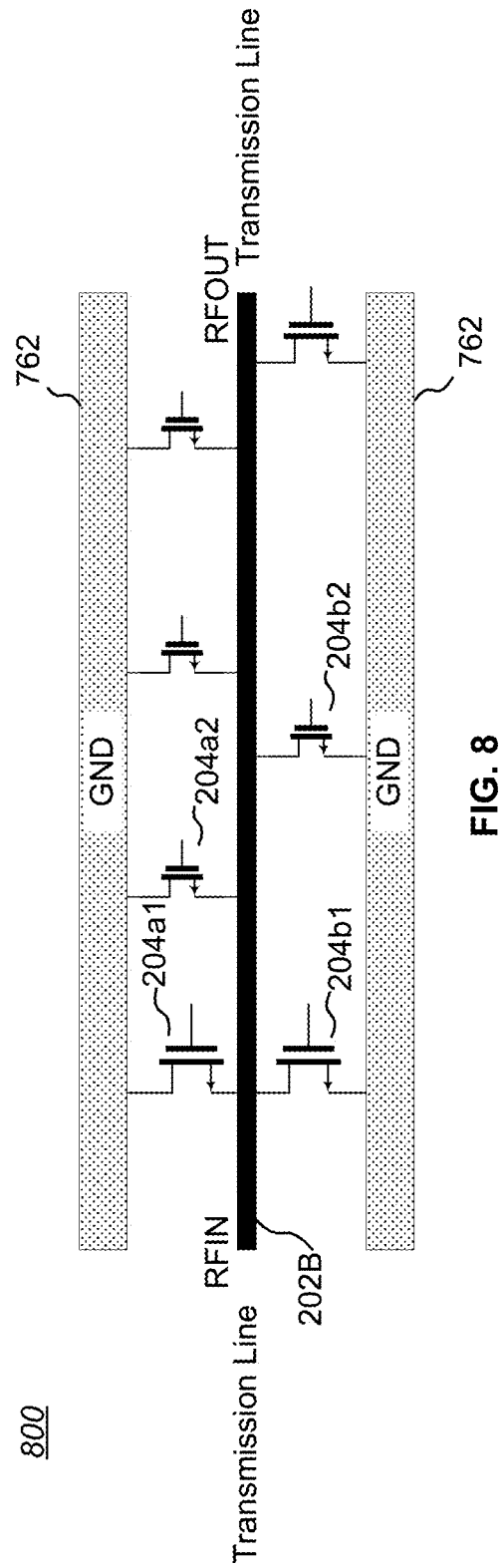
FIG. 8 is a hybrid schematic and layout depiction of a transmission line and varied shunt switch units that may be used in an arm of a signal switching device of the type shown in FIG. 6A.

In some embodiments, the shunt switch units 204 on one lateral side of the transmission line 202B need not necessarily be in a one-to-one relationship with the shunt switch units 204 on the other lateral side of the transmission line 202B, nor need all of the shunt switch units 204 be of the same size, thus providing even further design flexibility. For example, FIG. 8 is a hybrid schematic and layout depiction of a transmission line 202B and varied shunt switch units that may be used in an arm of a signal switching device of the type shown in FIG. 6A. The transmission line 202B is again shown as a continuous strip that is laterally bracketed by ground strips 762. Sets of shunt switch units 204a1, 204b1, 204a2, 204b2 represented as a FETs are shown connected between the transmission line 202B and associated ground strips 762 (only a few shunt switch units are numbered to avoid clutter).

In this example, there are four shunt switch units on one side of the transmission line 202B, but only three shunt switch units on the other side of the transmission line 202B. More generally, the number of shunt switch units on one side of a transmission line may be $X_1$, while the number of shunt switch units on the other side of the transmission line may be $X_2$. FIGS. 6A-6C and 7A-7D depict embodiments in which $X_1=X_2$, while FIG. 8 depict an embodiment in which $X_1 \neq X_2$.

The example of FIG. 8 also shows that the shunt switch units 204a1, 204b1 near an RFIN input port are physically larger (i.e., lower $R_{SH}$) than other shunt switch units 204a2, 204b2 along the transmission line 202B closer to an RFOUT port (note that only one low $R_{SH}$ shunt switch unit may be needed, rather than one such FET shunt switch unit per side of the transmission line 202B). Such a configuration is useful when the shunt switch units 204a1, 204b1 are in an ON state, and thus present an impedance $R_{SH}$ to circuit ground 762. Having $R_{SH}$ be lower for the shunt switch units near an RF input signal provides for faster dissipation to ground of any leakage current present at the input without going through "downstream" inductances and resistances, which could adversely impact isolation to the RF terminal port. For bidirectional signal switching devices, it may be useful to have at least one larger shunt switch unit (i.e., lower $R_{SH}$) at each end of a transmission line 202B. It may be desirable to configure downstream or "middle" shunt switch units with smaller sizes (higher $R_{SH}$ but lower $C_{SH}$) to better limit the parasitic capacitances presented by the shunt switch units.

Figure 9A:
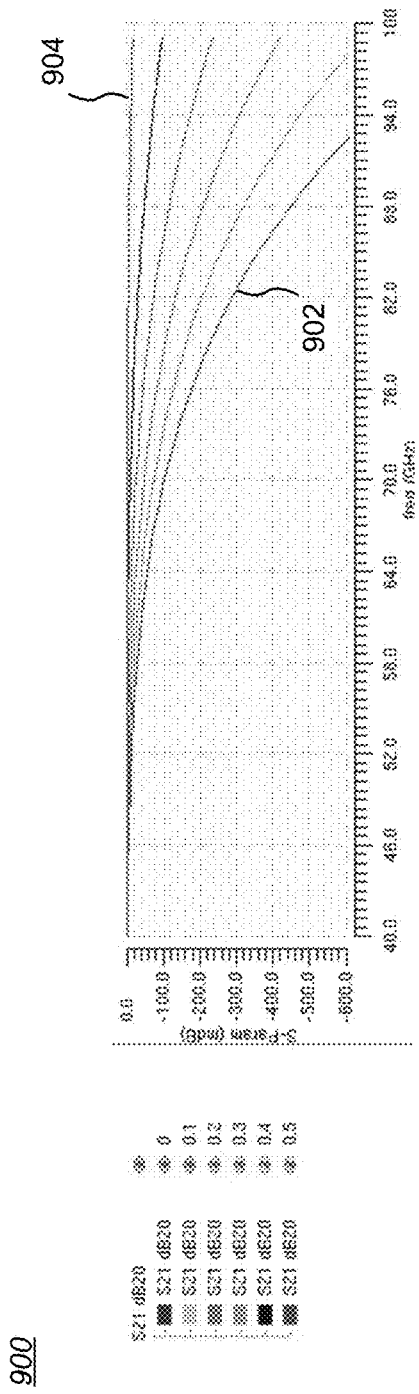
FIG. 9A is a graph showing insertion loss as a function of frequency for various offset ratios ranging from 0 to 0.5 in a modeled RF switch circuit of the type shown in FIGS. 6A and 7C.

An advantage of having the relative offset of pairs of shunt switch units 204an, 204bn along the transmission line 202B be greater than zero is a greater distribution of the parasitic capacitances $C_{SH}$ along the transmission line 202B, generally resulting in lower insertion loss and greater bandwidth. For example, FIG. 9A is a graph 900 showing insertion loss as a function of frequency for various offset ratios ranging from 0 to 0.5 in a modeled RF switch circuit of the type shown in FIGS. 6A and 7C. Graph line 902 shows the insertion loss with zero offset (i.e., the aligned case) of shunt switch units, such as would be the case for the circuit type shown in FIG. 6A; insertion loss increases significantly after about 64 GHz. In this specific example, insertion loss is less at higher frequencies when some degree of offset greater than zero is utilized, with best performance at an offset ratio of 0.5 (50%), as shown by graph line 904. The resonant frequency (S11) also increases as the offset ratio is increased from 0 to 0.5 (see FIG. 9B for an example).

Figure 9B:
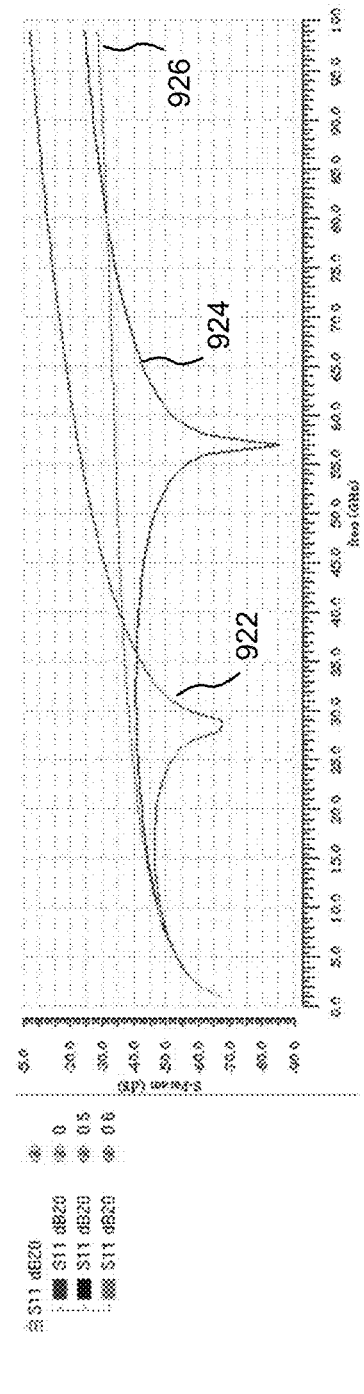
FIG. 9B is a graph showing return loss as a function of frequency for offset ratios 0, 0.5, and 0.6 in a modeled RF switch circuit of the type shown in FIGS. 6A and 7C.

In general, insertion loss as a function of frequency is not symmetrical with respect to offset ratios above 0.5 compared to offset ratios below 0.5. Thus, a ratio of 0.75 shows less roll-off at higher frequencies compared to a ratio of 0.25, but a ratio of 1.0 shows more roll-off at higher frequencies compared to a ratio of 0. However, in some applications, there may be some advantages to moving beyond an offset ratio of 0.5, to about 0.6 or even greater. For example, FIG. 9B is a graph 920 showing return loss as a function of frequency for offset ratios 0, 0.5, and 0.6 in a modeled RF switch circuit of the type shown in FIGS. 6A and 7C. For an offset ratio of 0.6, the insertion loss (IL) would be very similar to the IL of an offset ratio of 0.5 (50%) shown by graph line 904 in FIG. 9A (more specifically, for this model, the IL for an offset ratio of 0.6 shows about 0.002 dB degradation at 60 GHz compared to an offset ratio of 0.5, but about a 0.01 dB relative improvement at 100 GHz). As shown in FIG. 9B, graph lines 922 and 924, offset ratios of 0 and 0.5 exhibit a resonance inflection (around about 28 GHz for a ratio of 0, and around about 57 GHz for a ratio of about 0.5). In contrast, as shown by graph line 926, an offset ratio of 0.6 exhibits no significant resonance inflection and improved return loss at peak frequencies. In general, offset ratios greater than about 0.5 exhibit no significant resonance inflection.

Another benefit of offset ratios greater than about 0.5 (e.g., 0.6) includes flatter impedance levels as a function of frequency. For example, FIG. 9C is a graph 940 showing real impedance as a function of frequency for offset ratios 0, 0.5, and 0.6 in a modeled RF switch circuit of the type shown in FIGS. 6A and 7C, and FIG. 9D is a graph 940 showing imaginary impedance as a function of frequency for offset ratios 0, 0.5, and 0.6 in a modeled RF switch circuit of the type shown in FIGS. 6A and 7C. FIG. 9C illustrates that the real impedance level for an offset ratio of 0.6 (graph line 942) exhibits a smooth, substantially flat behavior across the frequency range and stays slightly above 50 ohms (which can be readily brought to 50 ohms by adding a high impedance shunt element) compared to an offset ratio of 0.5 (graph line 944). Similarly, FIG. 9D illustrates that the imaginary impedance level for an offset ratio of 0.6 (graph line 962) stays predominantly inductive and exhibits a smooth behavior across the frequency range compared to an offset ratio of 0.5 (graph line 964).

Yet another benefit of offset ratios greater than about 0.5 (e.g., 0.6) includes essentially no Group Delay variation as a function of frequency, whereas offset ratios less than about 0.5 exhibit a significant variation in Group Delay; Group Delay is defined as change in phase versus change in frequency:

$$GD = -\frac{\Delta\phi}{\Delta\omega}$$

For example, FIG. 9E is a graph 980 showing Group Delay as a function of frequency in a modeled RF switch circuit of the type shown in FIGS. 6A and 7C. FIG. 9E illustrates that the Group Delay variation for an offset ratio of 0.6 (graph line 982) is very small (about 2.7 pSec) across all measured frequencies, compared to a significant deviation in Group Delay around 58 GHz for an offset ratio of 0.5 (graph line 984).

Note that RF switching circuits of the type shown in FIG. 6A that have more than one terminal port—i.e., more than one arm of transmission line with associated shunt switch units—need not have the same characteristics for each arm. Thus, for example, in FIG. 6A, the number and size of the sets of n shunt switches 604 connected to series switch 602A may differ from the number and size of the sets of n shunt switches 604 connected to series switch 602B. Such sets of n shunt switches 604 may be aligned pairs of shunt switch units for one or more arms, and offset shunt switch units (paired or in odd sets) for one or more other arms.

Methods

Figure 10:
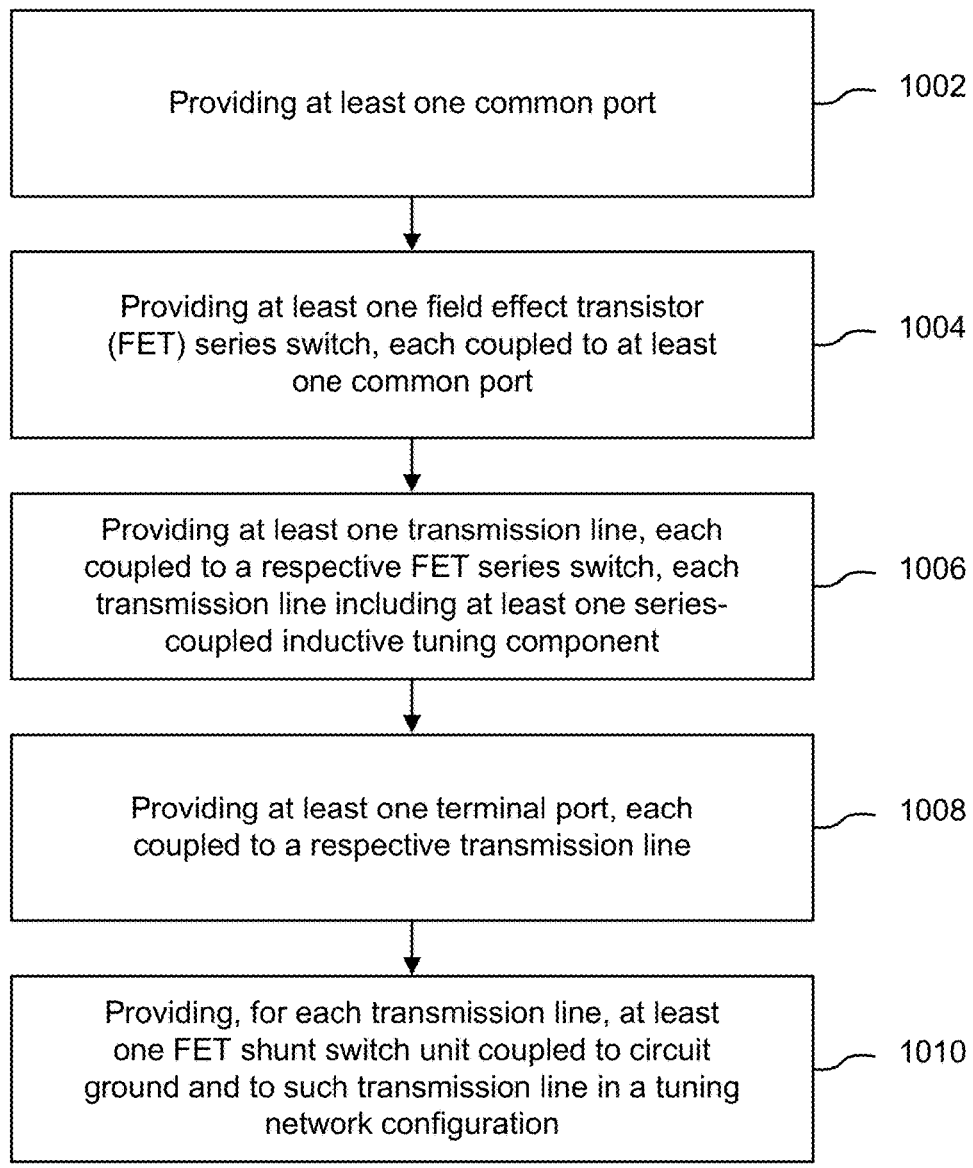
FIG. 10 is a process flow chart of a first method for configuring a radio frequency switching device.

Another aspect of the invention includes methods for configuring a radio frequency switching device For example, FIG. 10 is a process flow chart 1000 of a first method for configuring a radio frequency switching device, including the steps of:

Providing at least one common port (STEP 1002);

Providing at least one field effect transistor (FET) series switch, each coupled to at least one common port (STEP 1004);

Providing at least one transmission line, each coupled to a respective FET series switch, each transmission line including at least one series-coupled inductive tuning component (STEP 1006);

Providing at least one terminal port, each coupled to a respective transmission line (STEP 1008); and Providing, for each transmission line, at least one FET shunt switch unit coupled to circuit ground and to such transmission line in a tuning network configuration (STEP 1010).

Figure 11:
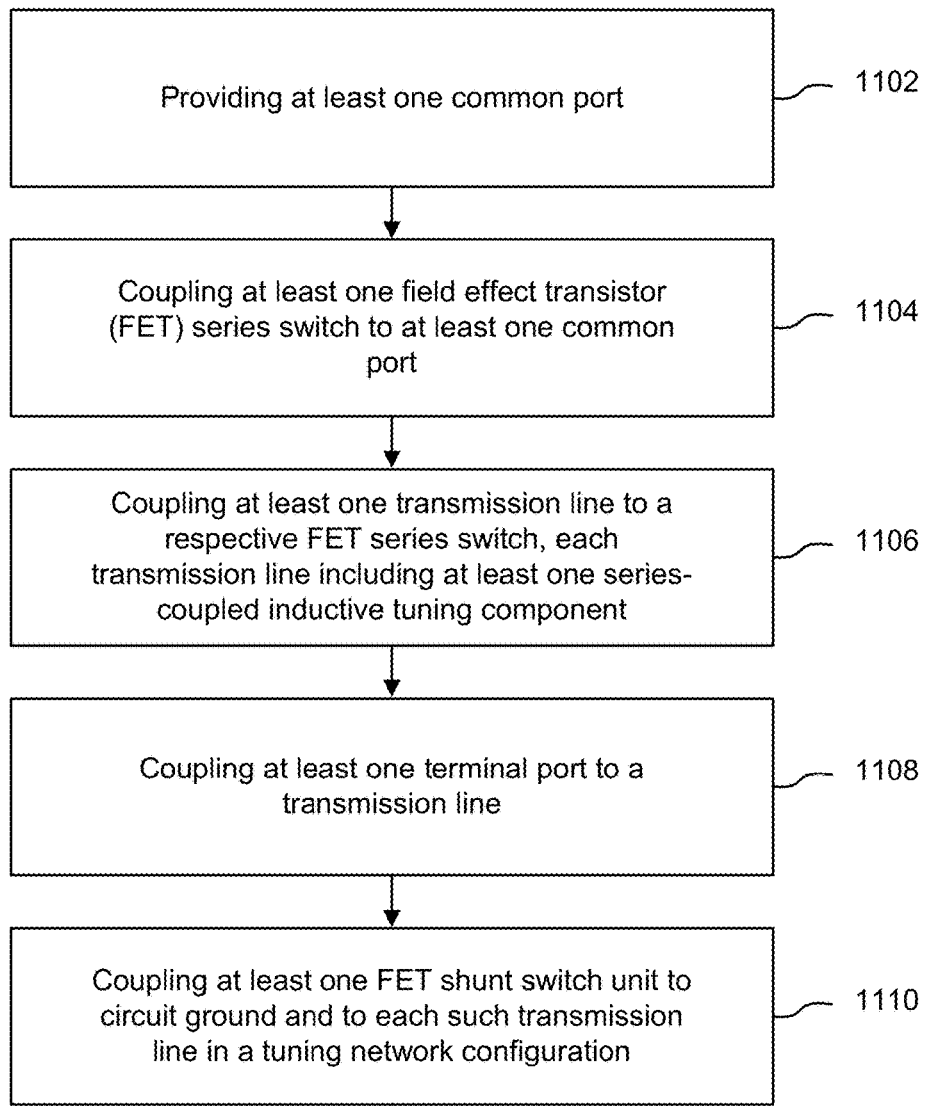
FIG. 11 is a process flow chart of a second method for configuring a radio frequency switching device.

As another example, FIG. 11 is a process flow chart 1100 of a second method for configuring a radio frequency switching device, including the steps of:

Providing at least one common port (STEP 1102);

Coupling at least one field effect transistor (FET) series switch to at least one common port (STEP 1104);

Coupling at least one transmission line to a respective FET series switch, each transmission line including at least one series-coupled inductive tuning component (STEP 1106);

Coupling at least one terminal port to a transmission line (STEP 1108); and

Coupling at least one FET shunt switch unit to circuit ground and to each such transmission line in a tuning network configuration (STEP 1110).

Figure 12:
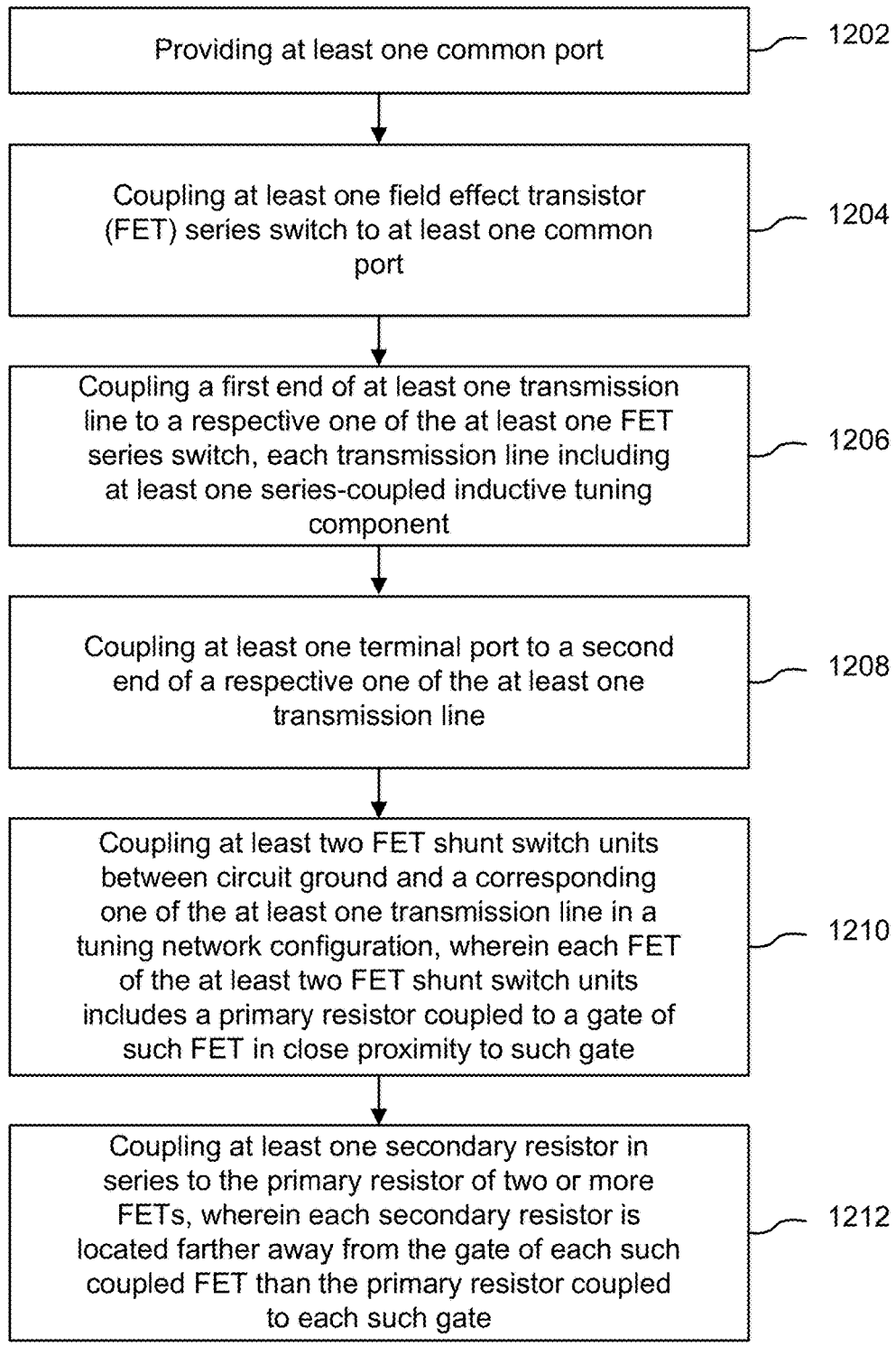
FIG. 12 is a process flow chart of a third method for configuring a radio frequency switching device.

As yet another example, FIG. 12 is a process flow chart 1200 of a third method for configuring a radio frequency switching device, including:

Providing at least one common port (STEP 1202);

Coupling at least one field effect transistor (FET) series switch to at least one common port (STEP 1204);

Coupling a first end of at least one transmission line to a respective one of the at least one FET series switch, each transmission line including at least one series-coupled inductive tuning component (STEP 1206);

Coupling at least one terminal port to a second end of a respective one of the at least one transmission line (STEP 1208);

Coupling at least two FET shunt switch units between circuit ground and a corresponding one of the at least one transmission line in a tuning network configuration, wherein each FET of the at least two FET shunt switch units includes a primary resistor coupled to a gate of such FET in close proximity to such gate (STEP 1210); and Coupling at least one secondary resistor in series to the primary resistor of two or more FETs wherein each secondary resistor is located farther away from the gate of each such coupled FET than the primary resistor coupled to each such gate (STEP 1212).

Figure 13:
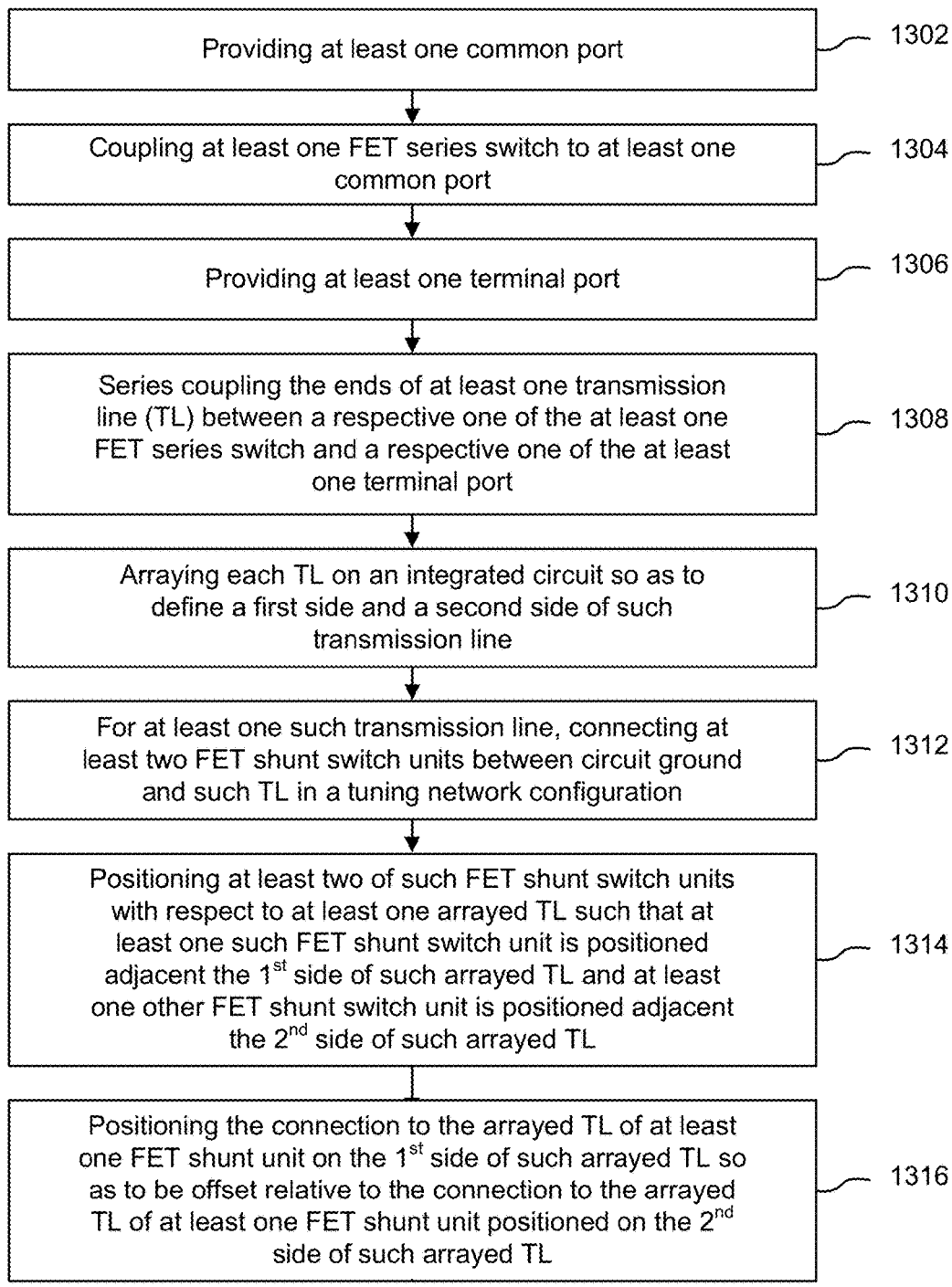
FIG. 13 is a process flow chart of a fourth method for configuring a radio frequency switching device.

As yet another example, FIG. 13 is a process flow chart 1300 of a fourth method for configuring a radio frequency switching device, including:

Providing at least one common port (STEP 1302);

Coupling at least one field effect transistor (FET) series switch to at least one common port (STEP 1304);

Providing at least one terminal port (STEP 1306);

Series coupling the ends of at least one transmission line between a respective one of the at least one FET series switch and a respective one of the at least one terminal port (STEP 1308);

Arraying each transmission line on an integrated circuit so as to define a first side and a second side of such transmission line (STEP 1310);

For at least one such transmission line, connecting at least two FET shunt switch units between circuit ground and such transmission line in a tuning network configuration (STEP 1312);

Positioning at least two of such FET shunt switch units with respect to at least one arrayed transmission line such that at least one such FET shunt switch unit is positioned adjacent the first side of such arrayed transmission line and at least one other FET shunt switch unit is positioned adjacent the second side of such arrayed transmission line (STEP 1314); and Positioning the connection to the arrayed transmission line of at least one FET shunt unit on the first side of such arrayed transmission line so as to be offset relative to the connection to the arrayed transmission line of at least one FET shunt unit positioned on the second side of such arrayed transmission line (STEP 1316).

The described methods can be extended to include one or more of the following: physically positioning pairs of the FET shunt switch units on both sides of each of the at least one transmission line; arraying the at least one transmission line on an integrated circuit layout in a substantially symmetrical manner; configuring at least one FET shunt unit as a series-coupled stack of FET switches; configuring at least one FET series switch as a series-coupled stack of FET switches; coupling at least one primary resistor to a gate of each FET in the FET shunt unit in close proximity to such gate, and providing at least one secondary resistor each series coupled to the primary resistors of two or more FETs but located farther away from the gate of each such FET than the primary resistors coupled to each such gate; coupling at least one secondary isolation FET series switch between a respective one of the at least one transmission line and a respective one of the at least one terminal port; fabricating the described circuitry as an integrated circuit; and embodying the radio frequency switching device on a silicon-on-insulator integrated circuit substrate.

The described methods may also be extended to include one or more of the following: the connections to the arrayed transmission line of all FET shunt units being positioned on the first side of such arrayed transmission line offset relative to the connections to the arrayed transmission line of all FET shunt units positioned on the second side of such arrayed transmission line; the number of FET shunt switch unit positioned adjacent the first side of such arrayed transmission line being different from the number of FET shunt switch unit positioned adjacent the second side of such arrayed transmission line; at least one FET shunt switch unit having an ON state resistance larger than the ON state resistance of at least one other FET shunt switch unit; at least one FET shunt switch unit adjacent an end of the transmission line having an ON state resistance larger than the ON state resistance of at least one other FET shunt switch unit; the radio frequency switching device including at least two transmission lines, and wherein a first configuration of FET shunt switch units coupled to a first one of the least one transmission line differs from a second configuration of FET shunt switch units coupled to a second one of the least one transmission line; the first configuration of FET shunt switch units having a different number of FET shunt switch units than the second configuration of FET shunt switch units; and at least one FET shunt switch unit having an ON state resistance larger than the ON state resistance of at least one other FET shunt switch unit.

Fabrication Technologies & Options

As should be readily apparent to one of ordinary skill in the art, various embodiments of the invention can be implemented to meet a wide variety of specifications. Thus, selection of suitable component values are a matter of design choice unless otherwise noted. The switching and passive elements may be implemented in any suitable integrated circuit (IC) technology, including but not limited to MOS-FET and IGFET structures. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to tolerate greater voltages (including as described above), and/or using multiple components in parallel to tolerate greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A radio frequency switching device including:
   (a) at least one common port;
   (b) at least one field effect transistor (FET) series switch, each coupled to at least one common port;
   (c) at least one terminal port;
   (d) at least one transmission line, the ends of each transmission line being series coupled between a respective one of the at least one FET series switch and a respective one of the at least one terminal port, each transmission line being arrayed on an integrated circuit so as to define a first side and a second side of such transmission line; and
   (e) for at least one such transmission line, at least two FET shunt switch units connected between circuit ground and such transmission line in a tuning network configuration;
   wherein at least two FET shunt switch units are positioned with respect to at least one arrayed transmission line such that at least one such FET shunt switch unit is positioned adjacent the first side of such arrayed transmission line and at least one other FET shunt switch unit is positioned adjacent the second side of such arrayed transmission line, and wherein the connection to the arrayed transmission line of at least one FET shunt unit positioned on the first side of such arrayed transmission line is offset relative to the connection to the arrayed transmission line of at least one FET shunt unit positioned on the second side of such arrayed transmission line.

2. The invention of claim 1, wherein the connections to the arrayed transmission line of all FET shunt units positioned on the first side of such arrayed transmission line are offset relative to the connections to the arrayed transmission line of all FET shunt units positioned on the second side of such arrayed transmission line.

3. The invention of claim 1, wherein the number of FET shunt switch unit positioned adjacent the first side of such arrayed transmission line is different from the number of FET shunt switch unit positioned adjacent the second side of such arrayed transmission line.

4. The invention of claim 1, wherein at least one FET shunt switch unit has an ON state resistance larger than the ON state resistance of at least one other FET shunt switch unit.

5. The invention of claim 1, wherein at least one FET shunt switch unit adjacent an end of the transmission line has an ON state resistance larger than the ON state resistance of at least one other FET shunt switch unit.

6. The invention of claim 1, wherein the radio frequency switching device includes at least two transmission lines, and wherein a first configuration of FET shunt switch units coupled to a first one of the least two transmission lines differs from a second configuration of FET shunt switch units coupled to a second one of the least two transmission lines.

7. The invention of claim 6, wherein the first configuration of FET shunt switch units has a different number of FET shunt switch units than the second configuration of FET shunt switch units.

8. The invention of claim 6, wherein at least one FET shunt switch unit has an ON state resistance larger than the ON state resistance of at least one other FET shunt switch unit.

9. The invention of claim 1, wherein the radio frequency switching device is embodied on a silicon-on-insulator integrated circuit substrate.

10. The invention of claim 1, wherein each FET of the at least two FET shunt switch units includes a primary resistor coupled to a gate of such FET in close proximity to such gate, and further including at least one secondary resistor each series coupled to the primary resistor of two or more of such FETs but located farther away from the gate of each such FET than the primary resistor coupled to each such gate.

11. The invention of claim 1, wherein at least one FET shunt unit includes a series-coupled stack of FET switches.

12. The invention of claim 1, wherein at least one FET series switch includes a series-coupled stack of FET switches.

13. The invention of claim 1, wherein the connections to the arrayed transmission line of the at least two FET shunt switch units have an offset ratio greater than about 0.5.

14. A method for configuring a radio frequency switching device, including:
   (a) providing at least one common port;
   (b) coupling at least one field effect transistor (FET) series switch to at least one common port;
   (c) providing at least one terminal port;
   (d) series coupling the ends of at least one transmission line between a respective one of the at least one FET series switch and a respective one of the at least one terminal port;
   (e) arraying each transmission line on an integrated circuit so as to define a first side and a second side of such transmission line;
   (f) for at least one such transmission line, connecting at least two FET shunt switch units between circuit ground and such transmission line in a tuning network configuration;
   (g) positioning at least two of such FET shunt switch units with respect to at least one arrayed transmission line such that at least one such FET shunt switch unit is positioned adjacent the first side of such arrayed transmission line and at least one other FET shunt switch unit is positioned adjacent the second side of such arrayed transmission line; and (h) positioning the connection to the arrayed transmission line of at least one FET shunt switch unit on the first side of such arrayed transmission line so as to be offset relative to the connection to the arrayed transmission line of at least one FET shunt switch unit positioned on the second side of such arrayed transmission line.

15. The method of claim 14, wherein the connections to the arrayed transmission line of all FET shunt switch units positioned on the first side of such arrayed transmission line are offset relative to the connections to the arrayed transmission line of all FET shunt switch units positioned on the second side of such arrayed transmission line.

16. The method of claim 14, wherein the number of FET shunt switch unit positioned adjacent the first side of such arrayed transmission line is different from the number of FET shunt switch unit positioned adjacent the second side of such arrayed transmission line.

17. The method of claim 14, wherein at least one FET shunt switch unit has an ON state resistance larger than the ON state resistance of at least one other FET shunt switch unit.

18. The method of claim 14, wherein at least one FET shunt switch unit adjacent an end of the transmission line has an ON state resistance larger than the ON state resistance of at least one other FET shunt switch unit.

19. The method of claim 14, wherein the radio frequency switching device includes at least two transmission lines, and wherein a first configuration of FET shunt switch units coupled to a first one of the least two transmission lines differs from a second configuration of FET shunt switch units coupled to a second one of the least two transmission lines.

20. The method of claim 19, wherein the first configuration of FET shunt switch units has a different number of FET shunt switch units than the second configuration of FET shunt switch units.

21. The method of claim 19, wherein at least one FET shunt switch unit has an ON state resistance larger than the ON state resistance of at least one other FET shunt switch unit.

22. The method of claim 14, wherein the radio frequency switching device is embodied on a silicon-on-insulator integrated circuit substrate.

23. The method of claim 14, wherein each FET of the at least two FET shunt switch units includes a primary resistor coupled to a gate of such FET in close proximity to such gate, and further including coupling at least one secondary resistor each series to the primary resistor of two or more of such FETs but located farther away from the gate of each such FET than the primary resistor coupled to each such gate.

24. The method of claim 14, wherein at least one FET shunt switch unit includes a series-coupled stack of FET switches.

25. The method of claim 14, wherein at least one FET series switch includes a series-coupled stack of FET switches.

26. The method of claim 14, wherein the connections to the arrayed transmission line of the at least two FET shunt switch units have an offset ratio greater than about 0.5.

* * * * *